United States Patent
Tanaka

(10) Patent No.: US 8,952,446 B2
(45) Date of Patent: Feb. 10, 2015

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Hiroyasu Tanaka, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/018,733

(22) Filed: Sep. 5, 2013

(65) Prior Publication Data

US 2014/0284699 A1    Sep. 25, 2014

(30) Foreign Application Priority Data

Mar. 19, 2013  (JP) .................................. 2013-057244

(51) Int. Cl.
*H01L 29/792*   (2006.01)
*H01L 29/66*    (2006.01)

(52) U.S. Cl.
CPC ........ *H01L 29/792* (2013.01); *H01L 29/66833* (2013.01)
USPC ........... 257/326; 257/368; 257/393; 438/258; 438/266

(58) Field of Classification Search
CPC ............ H01L 27/0688; H01L 21/8221; H01L 29/792; H01L 29/66833
USPC ................... 257/326, 368, 393; 438/258, 266
See application file for complete search history.

(56) References Cited

U.S. PATENT DOCUMENTS

| | | | |
|---|---|---|---|
| 8,084,819 B2 | 12/2011 | Kim et al. | |
| 8,089,120 B2 * | 1/2012 | Tanaka et al. | ................. 257/324 |
| 8,173,533 B2 | 5/2012 | Kim et al. | |
| 8,415,742 B2 | 4/2013 | Kim et al. | |
| 2007/0252201 A1 | 11/2007 | Kito et al. | |
| 2010/0065900 A1 | 3/2010 | Murata et al. | |
| 2010/0163968 A1 | 7/2010 | Kim et al. | |
| 2010/0207195 A1 | 8/2010 | Fukuzumi et al. | |
| 2011/0284947 A1 | 11/2011 | Kito et al. | |
| 2011/0287597 A1 | 11/2011 | Kito et al. | |
| 2012/0064681 A1 | 3/2012 | Kim et al. | |
| 2012/0193700 A1 | 8/2012 | Kim et al. | |
| 2013/0126961 A1 | 5/2013 | Fukuzumi et al. | |

FOREIGN PATENT DOCUMENTS

| | | |
|---|---|---|
| JP | 2009-224633 | 10/2009 |
| JP | 2010-73812 A | 4/2010 |
| JP | 2010-157734 A | 7/2010 |

* cited by examiner

*Primary Examiner* — Tu-Tu Ho
(74) *Attorney, Agent, or Firm* — Oblon, Spivak, McClelland, Maier & Neustadt, L.L.P.

(57) ABSTRACT

According to one embodiment, a semiconductor memory device includes a substrate, a stacked body, a channel body, a memory film, first and second insulating separation films, a first and a second inter-layer insulating films, a selection gate, a conductive layer, and resistance elements. The substrate includes a memory cell array region and a peripheral region. The stacked body includes electrode films and insulating films. The channel body extends in a stacking direction. The memory film includes a charge storage film. The first insulating separation films divide the stacked body. The first and the second inter-layer insulating films are on the stacked body and on the conductive layer, respectively. The selection gate is on the first inter-layer insulating film. The conductive layer is on the peripheral region. The resistance elements are on the second inter-layer insulating film. The second insulating separation films divide the conductive layer.

15 Claims, 19 Drawing Sheets

SEMICONDUCTOR MEMORY DEVICE AND METHOD FOR MANUFACTURING SAME

CROSS-REFERENCE TO RELATED APPLICATION

This application is based upon and claims the benefit of priority from Japanese Patent Application No. 2013-057244, filed on Mar. 19, 2013; the entire contents of which are incorporated herein by reference.

FIELD

Embodiments described herein relate generally to a semiconductor memory device and a method for manufacturing the same.

BACKGROUND

A memory device having a three-dimensional structure has been proposed in which memory holes are made in a stacked body in which insulating layers are multiply stacked alternately with conductive layers that function as control gates of memory cells, and silicon bodies used to form channels are provided on the side walls of the memory holes with a charge storage film interposed between the silicon bodies and the side walls. In such a device, a peripheral circuit also is formed in the same chip as the memory cell array. There are various proposals for the resistance element structure of the peripheral circuit.

DETAILED DESCRIPTION

Figure 1:
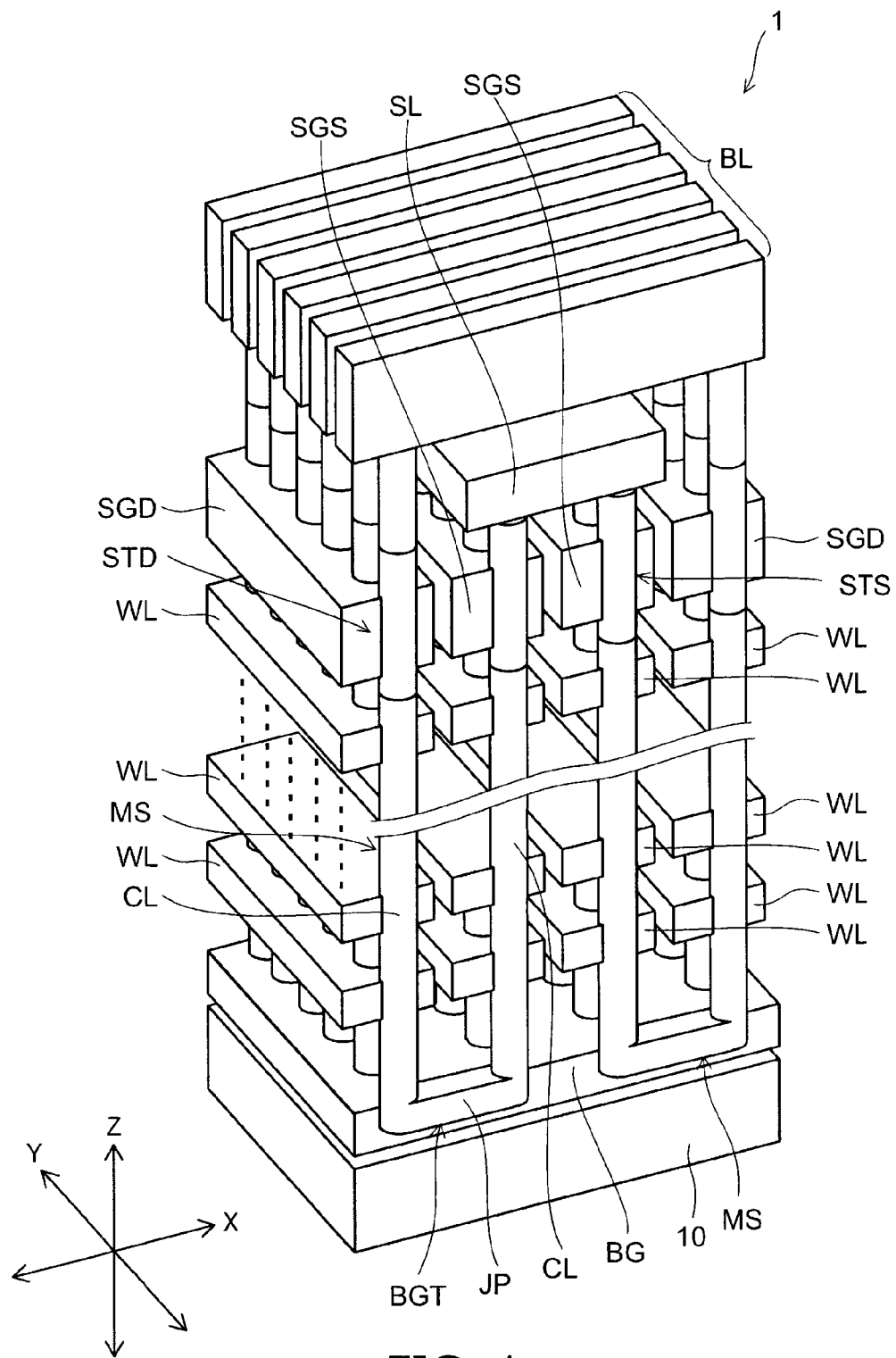
FIG. 1 is a schematic perspective view of a memory cell array of a semiconductor memory device of an embodiment.

According to one embodiment, a semiconductor memory device includes a substrate, a stacked body, a channel body, a memory film, a plurality of first insulating separation films, a first inter-layer insulating film, a selection gate, a conductive layer, a second inter-layer insulating film, a plurality of resistance elements, and a plurality of second insulating separation films. The substrate includes a memory cell array region and a peripheral region of a periphery of the memory cell array region. The stacked body is provided on the memory cell array region of the substrate. The stacked body includes a plurality of electrode films and a plurality of insulating films provided respectively between the electrode films. The channel body extends through the stacked body in a stacking direction of the electrode films and the insulating films. The memory film is provided between a side wall of the channel body and each of the electrode films. The first insulating separation films extend in the stacking direction through the stacked body to divide the stacked body into a plurality in a first direction. The first inter-layer insulating film is provided on the stacked body. The selection gate is provided on the first inter-layer insulating film to extend in a second direction intersecting the first direction. The conductive layer is provided on the peripheral region of the substrate. The conductive layer includes a film of a same material as the electrode film. The second inter-layer insulating film is provided on the conductive layer. The resistance elements are provided on the second inter-layer insulating film, and provided in a same layer as the selection gate. The second insulating separation films are configured to divide the conductive layer of the peripheral region into a block under the resistance element and at least one block provided under a region between the resistance elements adjacent to each other.

Various embodiments will be described hereinafter with reference to the accompanying drawings. Similar components in the drawings are marked with like reference numerals.

FIG. 1 is a schematic perspective view of a memory cell array 1 of a semiconductor memory device of an embodiment. In FIG. 1, the insulating portions are not shown for easier viewing of the drawing.

Figure 2:
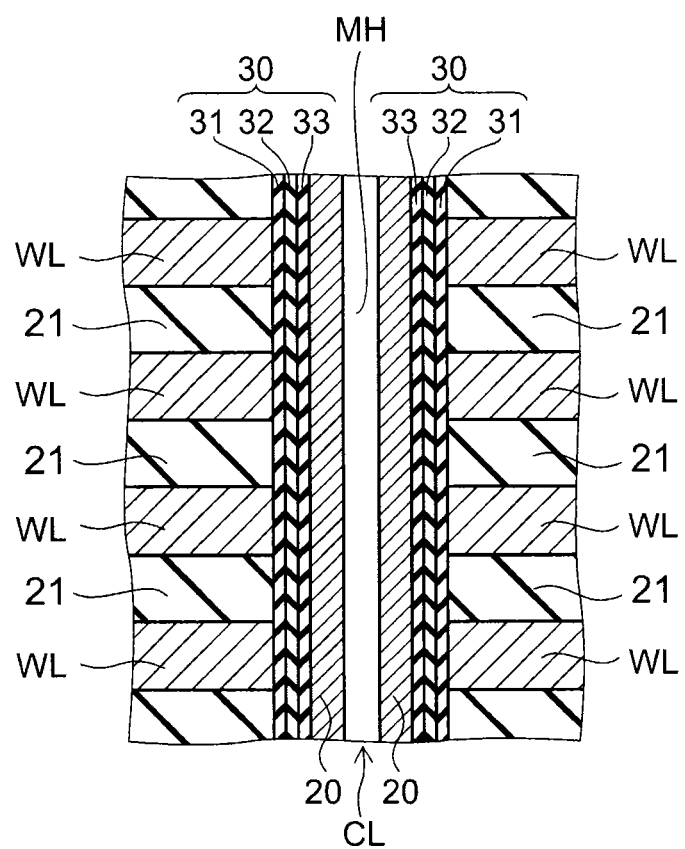
FIG. 2 is a schematic cross-sectional view of memory cells of the semiconductor memory device of the embodiment.

FIG. 2 is a schematic cross-sectional view of memory cells of the semiconductor memory device of the embodiment.

Figure 3:
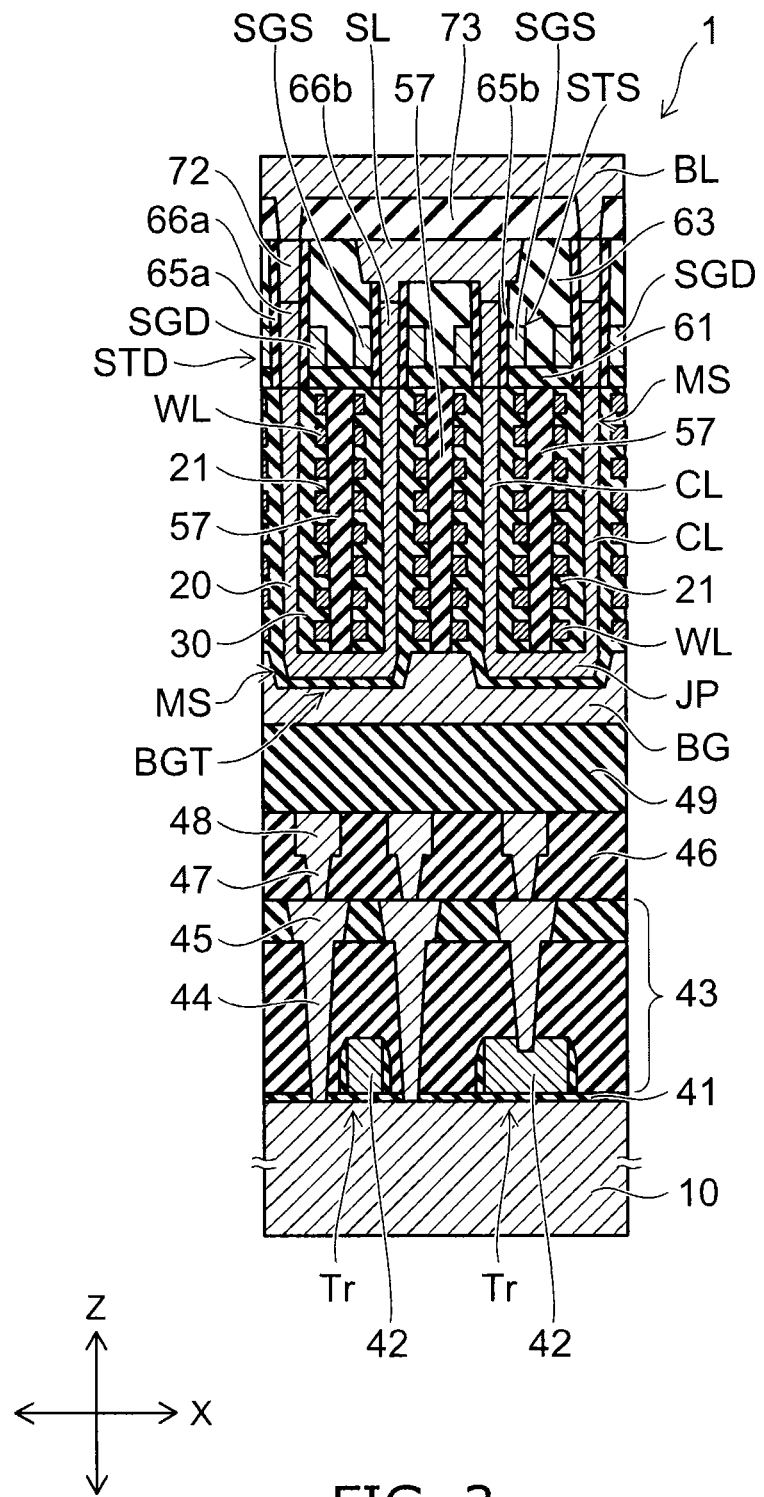
FIG. 3 is a schematic cross-sectional view of the memory cell array of the semiconductor memory device of the embodiment.

FIG. 3 is a schematic cross-sectional view of the memory cell array 1 of the semiconductor memory device of the embodiment.

The semiconductor memory device of the embodiment has a memory cell array region and a peripheral region of the periphery of the memory cell array region when viewed in plan from above a substrate 10. The memory cell array 1 is provided in the memory cell array region.

An XYZ orthogonal coordinate system is introduced in FIG. 1. Two mutually orthogonal directions parallel to the major surface of the substrate 10 are taken as an X-direction (a first direction) and a Y-direction (a second direction); and a direction orthogonal to both the X-direction and the Y-direction is taken as a Z-direction (the stacking direction of the stacked body or a third direction).

FIG. 3 corresponds to the XZ cross section of FIG. 1.

The memory cell array 1 includes multiple memory strings MS. One memory string MS is formed in a U-shaped configuration to include a pair of columnar portions CL that extend in the Z-direction and a linking portion JP that links the lower ends of the pair of columnar portions CL.

As shown in FIG. 3, multiple transistors Tr that are included in the peripheral circuit are formed at the front surface of the substrate 10. The peripheral circuit controls the memory cell array 1. The transistor Tr has, for example, a MOSFET (Metal-Oxide-semiconductor Field Effect transistor) structure and includes a gate insulating film 41 formed on the front surface of the substrate 10, a gate electrode 42 formed on the gate insulating film 41, etc.

An inter-layer insulating film 43 is formed on the front surface of the substrate 10; and a contact plug 44 and an interconnect 45 that is connected to the contact plug 44 are provided inside the inter-layer insulating film 43. The contact plug 44 is connected to the transistor Tr.

Further, an inter-layer insulating film 46 is provided on the interconnect 45; and a contact plug 47 and an interconnect 48 that is connected to the contact plug 47 are provided inside the inter-layer insulating film 46. The contact plug 47 is connected to the interconnect 45 of the lower layer.

The contact plugs and the interconnects that are connected to the transistor Tr are not limited to two layers and may be one, three, or more layers.

An insulating film 49 is provided on the interconnect 48; and a back gate BG that functions as the lower gate of the memory string MS is provided on the insulating film 49. The back gate BG is a conductive film and is, for example, a silicon film to which an impurity is added.

A stacked body that includes multiple electrode films WL and multiple insulating films 21 is provided on the back gate BG. The electrode films WL and the insulating films 21 are stacked alternately with each other. The number of layers of the electrode films WL is arbitrary and is not limited to the number of layers shown.

The insulating films 21 are provided between the electrode films WL. Also, the insulating film 21 is provided between the back gate BG and the electrode film WL of the lowermost layer. The uppermost layer of the stacked body is, for example, the insulating film 21.

The electrode film WL is a polycrystalline silicon film (a first silicon film) to which, for example, boron or phosphorus is added as an impurity.

A drain-side selection gate SGD is provided at the upper end portion of one of the pair of columnar portions CL of the memory string MS having the U-shaped configuration; and a source-side selection gate SGS is provided at the other upper end portion.

The drain-side selection gate SGD and the source-side selection gate SGS may be metal silicide films such as, for example, tungsten silicide films, etc. Or, similarly to the electrode film WL, the drain-side selection gate SGD and the source-side selection gate SGS may be polycrystalline silicon films to which, for example, boron or phosphorus is added as an impurity. Further, the drain-side selection gate SGD and the source-side selection gate SGS may be polycrystalline silicon films having side surfaces that are silicided. Also, one drain-side selection gate SGD may be formed of multiple gates; and one source-side selection gate SGS may be formed of multiple gates.

The drain-side selection gate SGD and the source-side selection gate SGS are provided on the stacked body including the multiple electrode films WL with a first inter-layer insulating film 61 interposed between the drain-side selection gate SGD and the stacked body and between the source-side selection gate SGS and the stacked body. The first inter-layer insulating film 61 is, for example, a silicon nitride film.

An insulating film 63 is provided between the drain-side selection gate SGD and the source-side selection gate SGS. The drain-side selection gate SGD and the source-side selection gate SGS are separated from each other in the X-direction by the insulating film 63.

The drain-side selection gate SGD and the source-side selection gate SGS are formed in line configurations that extend in the Y-direction.

A first insulating separation film 57 is provided between the pair of columnar portions CL of the memory string MS. The first insulating separation film 57 is, for example, a silicon nitride film.

The first insulating separation film 57 extends in the Y-direction to extend in the stacking direction (the Z-direction) through the stacked body including the electrode films WL to divide the stacked body in the X-direction.

The stacked body between the memory strings MS adjacent to each other in the X-direction also is divided in the X-direction by the first insulating separation film 57.

Each of the electrode films WL that is divided by the first insulating separation film 57 is formed in a line configuration that extends in the Y-direction.

The insulating film 63 is provided on the source-side selection gate SGS and on the drain-side selection gate SGD. A source line SL is provided on the source-side selection gate SGS with the insulating film 63 interposed. The source line SL is a metal film.

An insulating film 73 is provided on the insulating film 63 and on the source line SL. Bit lines BL are provided on the insulating film 73. The bit lines BL are metal films. The bit lines BL extend in the X-direction.

The source line SL is connected to a channel body 66b of a source-side selection transistor STS. The bit line BL is connected to a channel body 66a of a drain-side selection transistor STD.

A gate insulating film 65a is provided between the drain-side selection gate SGD and the channel body 66a. A gate insulating film 65b is provided between the source-side selection gate SGS and the channel body 66b. The gate insulating film 65a and the gate insulating film 65b are, for example, silicon nitride films.

The memory string MS includes a channel body 20 having a U-shaped configuration that is formed in the stacked body including the back gate BG, the multiple electrode films WL, and the multiple insulating films 21.

As described below, the channel body 20 is provided inside a memory hole made in a U-shaped configuration in the stacked body with a memory film 30 interposed. The channel body 20 is, for example, a silicon film that substantially does not include an impurity.

As shown in FIG. 2, the memory film 30 is provided between the channel body 20 and the side wall of a memory hole MH.

Although a structure in which the channel body 20 is provided such that a hollow portion remains at the central axis of the memory hole MH is shown in FIG. 2, a structure may be used in which the channel body 20 completely fills the interior of the memory hole MH or an insulating film is filled into the hollow portion inside the channel body 20.

The memory film 30 includes a blocking film 31, a charge storage film 32, and a tunneling film 33. The blocking film 31, the charge storage film 32, and the tunneling film 33 are provided in order from the electrode film WL side between the channel body 20 and each of the electrode films WL. The blocking film 31 contacts each of the electrode films WL; the tunneling film 33 contacts the channel body 20; and the charge storage film 32 is provided between the blocking film 31 and the tunneling film 33.

As described below, the insulating films 21 between the electrode films WL are formed simultaneously with the memory film 30. Accordingly, the insulating films 21 include at least the same material as the blocking film 31 of the memory film 30.

The channel body 20 functions as a channel of the memory cells; the electrode films WL function as control gates of the memory cells; and the charge storage film 32 functions as a data storage layer that stores the charge injected from the channel body 20. In other words, the memory cells are formed at the intersections between the channel body 20 and each of the electrode films WL and have a structure in which the control gate is provided around the channel.

The semiconductor memory device of the embodiment is a nonvolatile semiconductor memory device that can freely and electrically erase/program data and retain the memory content even when the power supply is OFF.

The memory cell is, for example, a charge trap memory cell. The charge storage film 32 has many trap sites that trap the charge and is, for example, a silicon nitride film.

The tunneling film 33 is, for example, a silicon oxide film and is used as a potential barrier when the charge is injected from the channel body 20 into the charge storage film 32 or when the charge stored in the charge storage film 32 diffuses into the channel body 20.

The blocking film 31 is, for example, a silicon oxide film and prevents the charge stored in the charge storage film 32 from diffusing into the electrode films WL.

One end portion of the channel body 20 having the U-shaped configuration is connected to the bit line BL via the channel body 66a of the drain-side selection transistor STD.

The other end portion of the channel body 20 having the U-shaped configuration is connected to the source line SL via the channel body 66b of the source-side selection transistor STS.

The back gate BG, the channel body 20 provided inside the back gate BG, and the memory film 30 provided inside the back gate BG are included in a back gate transistor BGT.

The memory cells having the electrode films WL of each layer as control gates are multiply provided between the drain-side selection transistor STD and the back gate transistor BGT. Similarly, the memory cells having the electrode films WL of each layer as control gates are multiply provided between the back gate transistor BGT and the source-side selection transistor STS.

The multiple memory cells, the drain-side selection transistor STD, the back gate transistor BGT, and the source-side selection transistor STS are connected in series via the channel body 20 and are included in one memory string MS having a U-shaped configuration. By the memory string MS being multiply arranged in the X-direction and the Y-direction, the multiple memory cells are provided three-dimensionally in the X-direction, the Y-direction, and the Z-direction.

The peripheral region will now be described.

Figure 4:
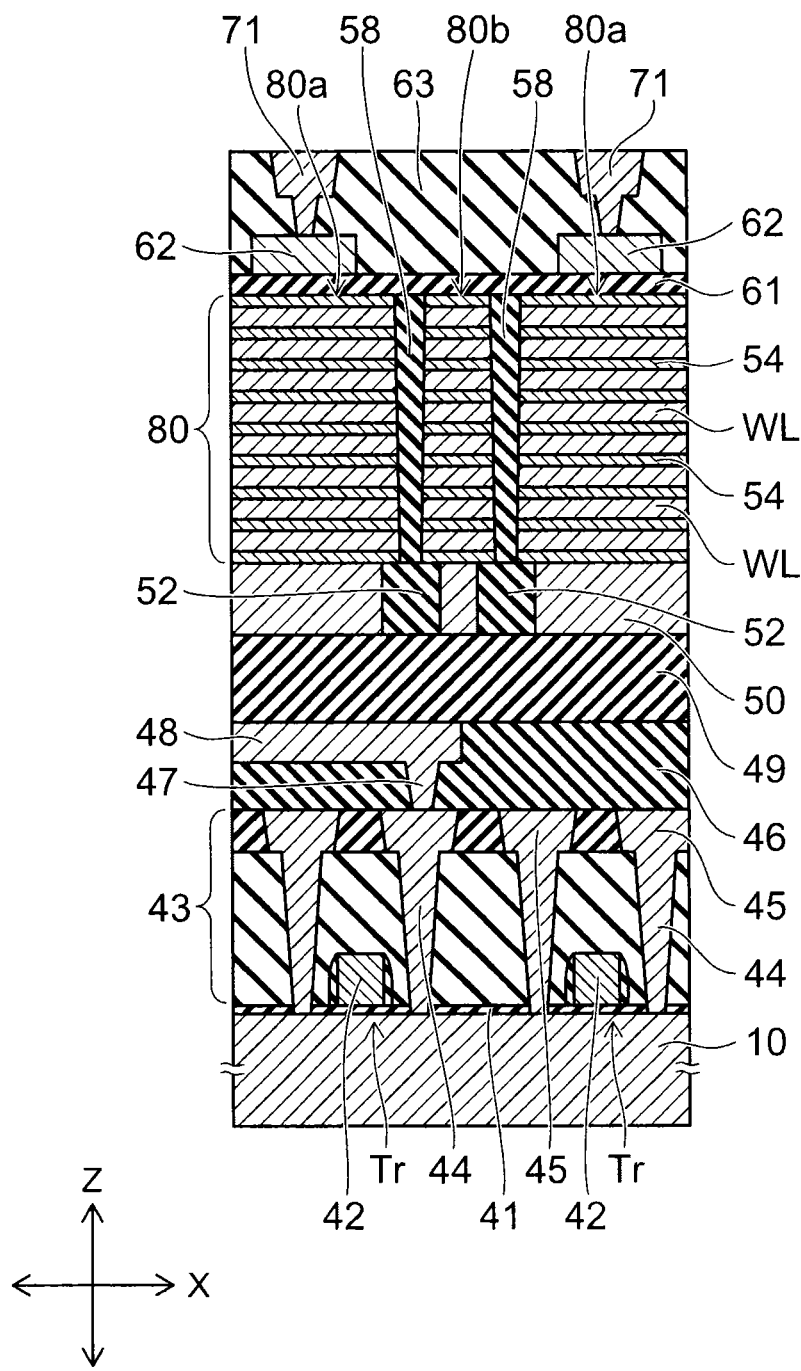
FIG. 4 is a schematic cross-sectional view of a peripheral region of the semiconductor memory device of the embodiment.

FIG. 4 is a schematic cross-sectional view of the structural body on the substrate 10 in the peripheral region. The structural body shown in FIG. 4 is provided at the periphery of the memory cell array 1. The X-direction of FIG. 4 matches the X-direction of FIG. 3; and the Z-direction of FIG. 4 matches the Z-direction of FIG. 3. The direction piercing the page surface in FIG. 4 corresponds to the Y-direction of FIG. 1.

Figure 5A:
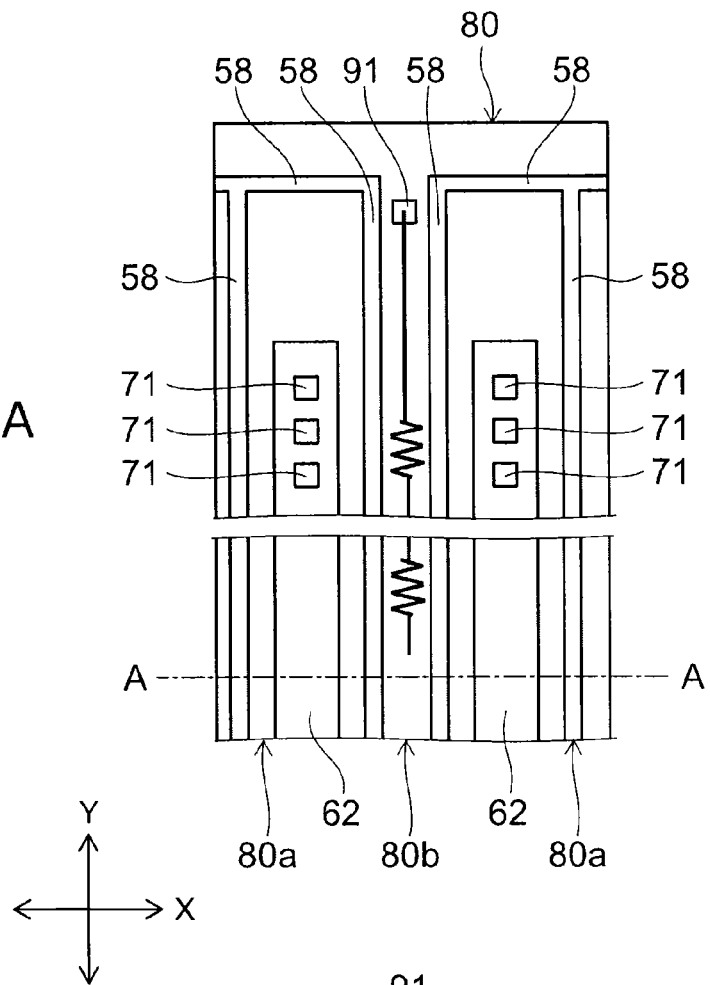
FIG. 5A to FIG. 9B are schematic views of the peripheral region of the semiconductor memory device of the embodiment.
Figure 5B:
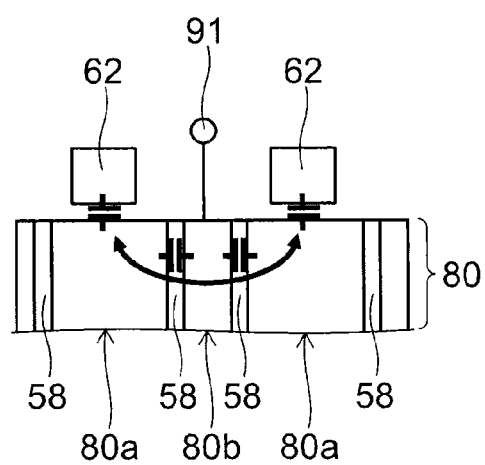

FIG. 5A is a schematic plan view of the peripheral region; and FIG. 5B corresponds to the A-A cross section of FIG. 5A.

The second inter-layer insulating film 61 between a conductive layer 80 and a resistance element 62 shown in FIG. 4 is not shown in FIG. 5B.

As shown in FIG. 4, the multiple transistors Tr that are included in the peripheral circuit are formed also at the front surface of the substrate 10 of the peripheral region. The transistor Tr includes the gate insulating film 41 formed on the front surface of the substrate 10, the gate electrode 42 formed on the gate insulating film 41, etc.

The inter-layer insulating film 43 is formed also on the front surface of the substrate 10 of the peripheral circuit; and the contact plug 44 and the interconnect 45 that is connected to the contact plug 44 are provided inside the inter-layer insulating film 43.

Further, the inter-layer insulating film 46 is provided on the interconnect 45; and the contact plug 47 and the interconnect 48 that is connected to the contact plug 47 are provided inside the inter-layer insulating film 46.

The insulating film 49 is provided on the interconnect 48; and a conductive layer (a second conductive layer) 50 is provided on the insulating film 49.

The conductive layer 50 is formed by the same process as the back gate BG of the memory cell array region and is made of the same material as the back gate BG. For example, the conductive layer 50 is a silicon film to which an impurity is added. The conductive layer 50 corresponds to the same layer as the back gate BG that is provided at the same height (the height having the substrate as a reference) as the back gate BG.

Multiple insulating separation films (third insulating separation films) 52 are provided inside the conductive layer 50. The insulating separation films 52 divide the conductive layer 50 into a plurality in the X-direction.

The conductive layer (the first conductive layer) 80 that includes the multiple first films and multiple second films 54 is provided on the conductive layer 50. The first films are formed in the same process as the electrode films WL of the memory cell array 1 and are made of the same material as the electrode films WL. The electrode films WL that are used as the first films in the peripheral region are, for example, polycrystalline silicon films to which boron or phosphorus is added as an impurity.

The electrode films WL and the second films 54 are stacked alternately on the conductive layer 50. The number of layers of the electrode films WL of the peripheral region is the same as the number of layers of the electrode films WL of the memory cell array 1.

The thickness of the conductive layer 80 is the same as the thickness of the stacked body including the electrode films WL and the insulating films 21 of the memory cell array 1. Also, the conductive layer 80 is formed at the same height from the major surface of the substrate 10 as the stacked body including the electrode films WL and the insulating films 21 of the memory cell array 1. The conductive layer 80 corresponds to the same layer as the stacked body including the electrode films WL and the insulating films 21 of the memory cell array 1 and is provided at the same height (the height having the substrate as a reference) as the stacked body.

The inter-layer insulating film (the second inter-layer insulating film) 61 is provided on the conductive layer 80. The inter-layer insulating film 61 of the peripheral region is formed of the same material as the inter-layer insulating film (the first inter-layer insulating film) 61 of the memory cell array region in the same process. The inter-layer insulating film 61 is, for example, a silicon nitride film. The inter-layer insulating film (the second inter-layer insulating film) 61 corresponds to the same layer as the inter-layer insulating film (the first inter-layer insulating film) 61 of the memory cell array region and is provided at the same height (the height having the substrate as a reference) as the inter-layer insulating film (the first inter-layer insulating film) 61.

The multiple resistance elements 62 are provided on the inter-layer insulating film 61. The resistance elements 62 are formed of the same material as the selection gates SGD and SGS of the memory cell array 1 in the same process. The resistance elements 62 may be, for example, tungsten silicide films. Or, the resistance elements 62 may be, for example, polycrystalline silicon films to which boron or phosphorus is added. The resistance elements 62 correspond to the same layer as the selection gates SGD and SGS of the memory cell array 1 and are provided at the same height (the height having the substrate as a reference) as the selection gates SGD and SGS.

The insulating film 63 is provided between the multiple resistance elements 62. The multiple resistance elements 62 are divided in the X-direction by the insulating film 63. The resistance elements 62 are formed in line configurations that extend in the Y-direction.

The thickness of the resistance elements 62 is the same as the thickness of the selection gates SGD and SGS of the memory cell array 1. Also, the resistance elements 62 and the selection gates SGD and SGS are provided at the same height from the major surface of the substrate 10.

The insulating film 63 is provided on the resistance elements 62. Contact members 71 are provided inside the insulating film 63. The contact members 71 are provided on the resistance elements 62 and are connected to the resistance elements 62.

A second insulating separation film 58 is provided inside the conductive layer 80. The second insulating separation film 58 is formed of the same material as the first insulating separation film 57 of the memory cell array region in the same process. The second insulating separation film 58 is, for example, a silicon nitride film.

The second insulating separation film 58 extends in the Y-direction to extend in the thickness direction (the Z-direction) of the conductive layer 80 to divide the conductive layer 80 into a plurality in the X-direction. Also, as shown in FIG. 5A, the insulating separation film 58 is formed to extend in the X-direction in a region that is further on the outer side than is the longitudinal-direction (Y-direction) end portion of the resistance element 62.

The lower end of the insulating separation film 58 reaches the insulating separation film 52 that is provided inside the conductive layer 50. The conductive body that includes the conductive layer 80 and the conductive layer 50 under the conductive layer 80 is divided into a plurality in the X-direction by the insulating separation film 58 and the insulating separation film 52.

As shown in FIGS. 5A and 5B, the insulating separation film 58 divides the conductive layer 80 into a conductive layer block 80a and a conductive layer block 80b. The conductive layer block 80a is positioned under the resistance element 62. The conductive layer block 80b is positioned under the region between the resistance elements 62 adjacent to each other in the X-direction.

The insulating separation film 58 is not provided under the resistance element 62. The resistance element 62 is provided on the conductive layer block 80a with the inter-layer insulating film 61 interposed.

The conductive layer block 80b is separated from the conductive layer block 80a in the X-direction by the insulating separation film 58. The resistance element 62 is not provided on the conductive layer block 80b.

A potential is provided to the resistance element 62 via the contact member 71 shown in FIG. 4 and FIG. 5A. A potential may be provided to the conductive layer block 80b via a contact member 91 shown in FIG. 5A. Or, the potential of the conductive layer block 80b may be floating. A potential may be provided to the conductive layer block 80a; or the conductive layer block 80a may be floating.

A comparative example will now be described.

Figure 24A:
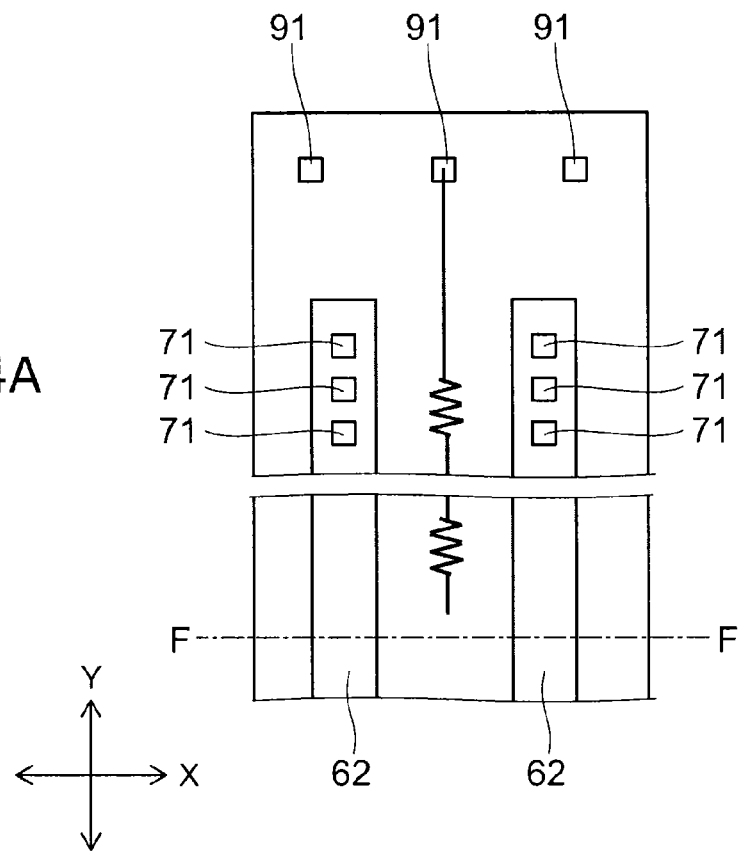
FIGS. 24A and 24B are schematic views of a peripheral region of a semiconductor memory device in a comparative example.

FIG. 24A is a schematic cross-sectional view of a portion of the peripheral region of the comparative example where the resistance elements 62 are provided and corresponds to the cross-sectional view shown in FIG. 5A of the embodiment.

Figure 24B:
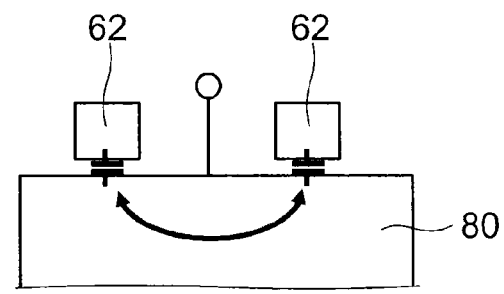

FIG. 24B shows the F-F cross section of FIG. 24A.

The comparative example differs from the embodiment in that the conductive layer 80 of the peripheral region is not divided by an insulating separation film.

The resistance elements 62 are capacitively coupled to the conductive layer 80 with the inter-layer insulating film 61 (shown in FIG. 4) interposed. In the case where the resistance elements 62 have high-speed operations, there is a risk that it may become difficult to fix the potential of the conductive layer 80 in regions that are distal to the contact member 91 that sets the potential of the conductive layer 80; and crosstalk may occur between the mutually-adjacent resistance elements 62.

In the memory string MS 1, the resistance of the channel body between the selection transistors and the memory cells of the uppermost layer is reduced by utilizing the fringe electric field from the selection gates SGD and SGS and the electrode film WL of the uppermost layer. Therefore, it is difficult to increase the distance between the selection gates SGD and SGS and the electrode film WL of the uppermost layer.

In other words, there is a constraint on how much the capacitance between the resistance element 62 and the conductive layer 80 in the peripheral region can be reduced by increasing the distance between the resistance element 62 and the conductive layer 80 when the resistance element 62 is formed of the same material as the selection gates SGD and SGS in the same process.

Therefore, according to the embodiment, the conductive layer 80 of the peripheral region is divided into the multiple blocks 80a and 80b by the insulating separation film 58. The resistance element 62 and the conductive layer block 80a under the resistance element 62 are capacitively coupled via the inter-layer insulating film 61 (shown in FIG. 4). The conductive layer block 80a and the conductive layer block 80b are capacitively coupled via the insulating separation film 58.

In other words, a bypass condenser including multiple capacitances is formed between the mutually-adjacent resistance elements 62; and the crosstalk between the resistance elements 62 can be prevented even in the case where the frequency of the voltage applied to the resistance elements 62 is high.

Two insulating separation films 58 exist under the region between the mutually-adjacent resistance elements 62. Therefore, the resistance element 62 is not provided on the conductive layer block 80b between the two insulating separation films 58. By providing the potential to the conductive layer block 80b, one resistance element 62 is not affected by the potential of a resistance element 62 adjacent to the one resistance element 62; and the crosstalk between the mutually-adjacent resistance elements 62 can be prevented.

For example, the ground potential may be provided to the conductive layer block 80b. Or, an intermediate potential (e.g., (Vmax+Vmin)/2) that is between the maximum voltage Vmax and the minimum voltage Vmin applied to the resistance element 62 may be provided to the conductive layer block 80b.

By providing the intermediate potential to the conductive layer block 80b, the maximum voltage that is applied to the resistance elements 62, the conductive layer 80, and the bypass condenser can be relaxed; and the stress on the insulating films (the inter-layer insulating film 61 and the insulating separation films 58) can be reduced.

Moreover, the insulating separation film 58 is not provided directly under the resistance element 62. Therefore, the unevenness of the stacked body under the resistance element 62 can be reduced; and the lithography defocus of the resistance element 62 can be reduced.

Other pattern examples of the insulating separation films 58 that divide the conductive layer 80 will now be described.

Figure 6A:
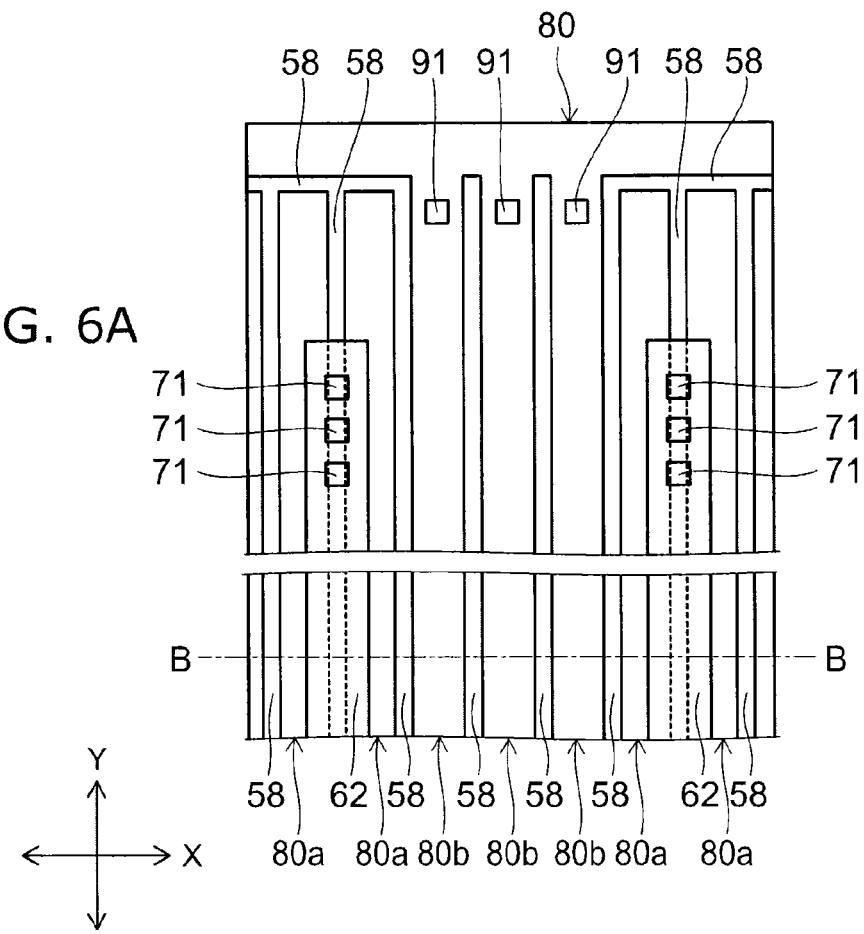
Figure 6B:
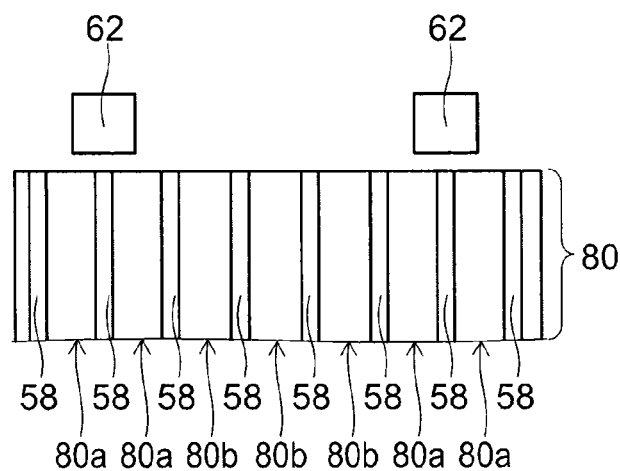

FIG. 6A is a schematic plan view of the peripheral region that is similar to FIG. 5A; and FIG. 6B corresponds to the B-B cross section of FIG. 6A.

In the specific example as well, the conductive layer 80 of the peripheral region is divided into the multiple blocks 80a and 80b by the insulating separation films 58. In other words, the bypass condenser including multiple capacitances is formed between the mutually-adjacent resistance elements 62; and the crosstalk between the resistance elements 62 can be prevented even in the case where the frequency of the voltage applied to the resistance elements 62 is high.

Three conductive layer blocks 80b that are separated by four insulating separation films 58 are provided under the region between the mutually-adjacent resistance elements 62.

The resistance element 62 is not provided on the conductive layer block 80b. By providing the potential to the conductive layer block 80b, one resistance element 62 is not affected by the potential of a resistance element 62 adjacent to the one resistance element 62; and the crosstalk between the mutually-adjacent resistance elements 62 can be prevented.

For example, the ground potential may be provided to the conductive layer block 80b. Or, an intermediate potential (e.g., (Vmax+Vmin)/2) that is between the maximum voltage Vmax and the minimum voltage Vmin applied to the resistance element 62 may be provided to the conductive layer block 80b.

By providing the intermediate potential to the conductive layer block 80b, the maximum voltage that is applied to the resistance elements 62, the conductive layer 80, and the bypass condenser can be relaxed; and the stress on the insulating films (the inter-layer insulating film 61 and the insulating separation films 58) can be reduced.

Also, the insulating separation films 57 of the memory cell array 1 are formed at the same pitch as the insulating separation films 58 of the peripheral region. Accordingly, the patterning (the lithography) of the mask for simultaneously making the slits into which the insulating separation films 57 are filled and the slits into which the insulating separation films 58 are filled can be performed with high precision.

Figures 7A, 7B:
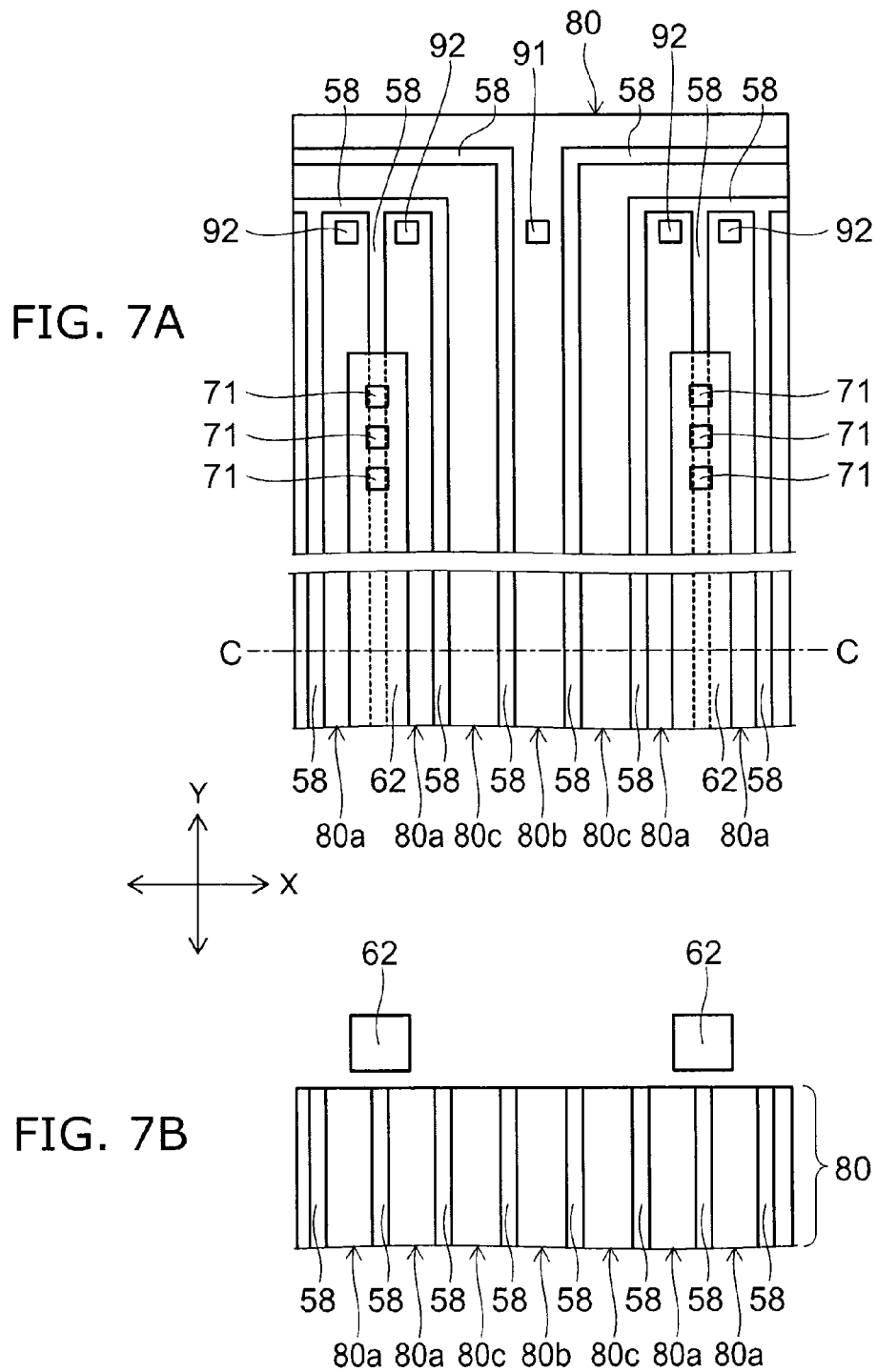

FIG. 7A is a schematic plan view of the peripheral region that is similar to FIG. 5A; and FIG. 7B corresponds to the C-C cross section of FIG. 7A.

In the specific example as well, the conductive layer 80 of the peripheral region is divided into the multiple blocks 80a, 80b, and 80c by the insulating separation films 58. In other words, the bypass condenser including multiple capacitances is formed between the mutually-adjacent resistance elements 62; and the crosstalk between the resistance elements 62 can be prevented even in the case where the frequency of the voltage applied to the resistance elements 62 is high.

One conductive layer block 80b and two conductive layer blocks 80c that are separated by four insulating separation films are provided under the region between the mutually-adjacent resistance elements 62.

The resistance element 62 is not provided on the conductive layer block 80b and the conductive layer block 80c. By providing the potential to the conductive layer block 80b, one resistance element 62 is not affected by the potential of a resistance element 62 adjacent to the one resistance element 62; and the crosstalk between the mutually-adjacent resistance elements 62 can be prevented.

For example, the ground potential may be provided to the conductive layer block 80b. Or, an intermediate potential (e.g., (Vmax+Vmin)/2) that is between the maximum voltage Vmax and the minimum voltage Vmin applied to the resistance element 62 may be provided to the conductive layer block 80b.

By providing the intermediate potential to the conductive layer block 80b, the maximum voltage that is applied to the resistance elements 62, the conductive layer 80, and the bypass condenser can be relaxed; and the stress on the insulating films (the inter-layer insulating film 61 and the insulating separation films 58) can be reduced.

A potential also may be provided to the conductive layer block 80a under the resistance element 62. The potential of the conductive layer block 80c, which is between the conductive layer block 80a and the conductive layer block 80b to which potentials are provided, is floating. Therefore, the effective film thickness of the insulating films can be increased; and the stress on the insulating films (the inter-layer insulating film 61 and the insulating separation films 58) can be reduced.

The insulating separation films 57 of the memory cell array 1 are formed at the same pitch as the insulating separation films 58 of the peripheral region. Accordingly, the patterning (the lithography) of the mask for simultaneously making the slits into which the insulating separation films 57 are filled and the slits into which the insulating separation films 58 are filled can be performed with high precision.

Figure 8A:
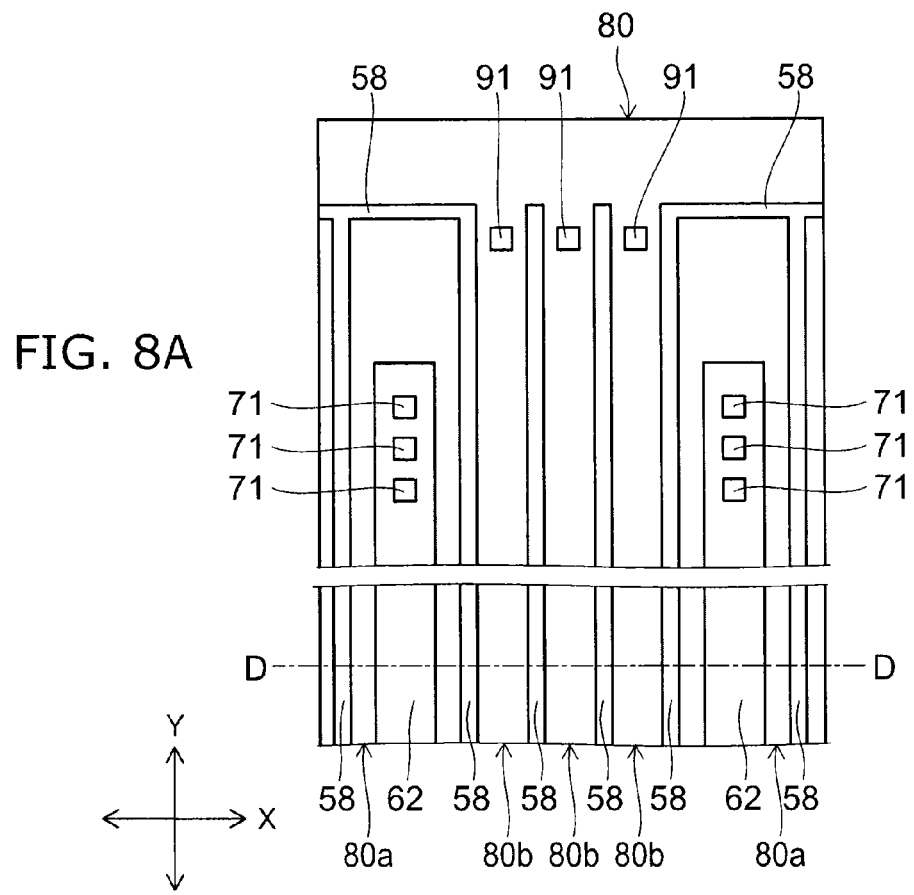
Figure 8B:
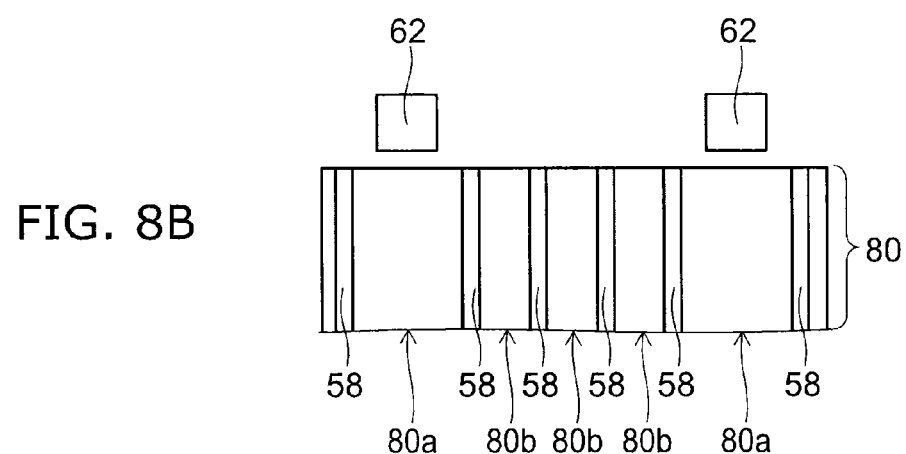

FIG. 8A is a schematic plan view of the peripheral region that is similar to FIG. 5A; and FIG. 8B corresponds to the D-D cross section of FIG. 8A.

In the specific example as well, the conductive layer 80 of the peripheral region is divided into the multiple blocks 80a and 80b by the insulating separation films 58. In other words, the bypass condenser including multiple capacitances is formed between the mutually-adjacent resistance elements 62; and the crosstalk between the resistance elements 62 can be prevented even in the case where the frequency of the voltage applied to the resistance elements 62 is high.

Three conductive layer blocks 80b that are divided by four insulating separation films 58 are provided under the region between the mutually-adjacent resistance elements 62.

The resistance element 62 is not provided on the conductive layer block 80b. By providing the potential to the conductive layer block 80b, one resistance element 62 is not affected by the potential of a resistance element 62 adjacent to the one resistance element 62; and the crosstalk between the mutually-adjacent resistance elements 62 can be prevented.

For example, the ground potential may be provided to the conductive layer block 80b. Or, the intermediate potential (e.g., (Vmax+Vmin)/2) that is between the maximum voltage Vmax and the minimum voltage Vmin applied to the resistance element 62 may be provided to the conductive layer block 80b.

By providing the intermediate potential to the conductive layer block 80b, the maximum voltage that is applied to the resistance elements 62, the conductive layer 80, and the bypass condenser can be relaxed; and the stress on the insulating films (the inter-layer insulating film 61 and the insulating separation films 58) can be reduced.

The insulating separation film 58 is not provided directly under the resistance element 62. Therefore, the unevenness of the stacked body under the resistance element 62 can be reduced; and the lithography defocus of the resistance element 62 can be reduced.

Figure 9A:
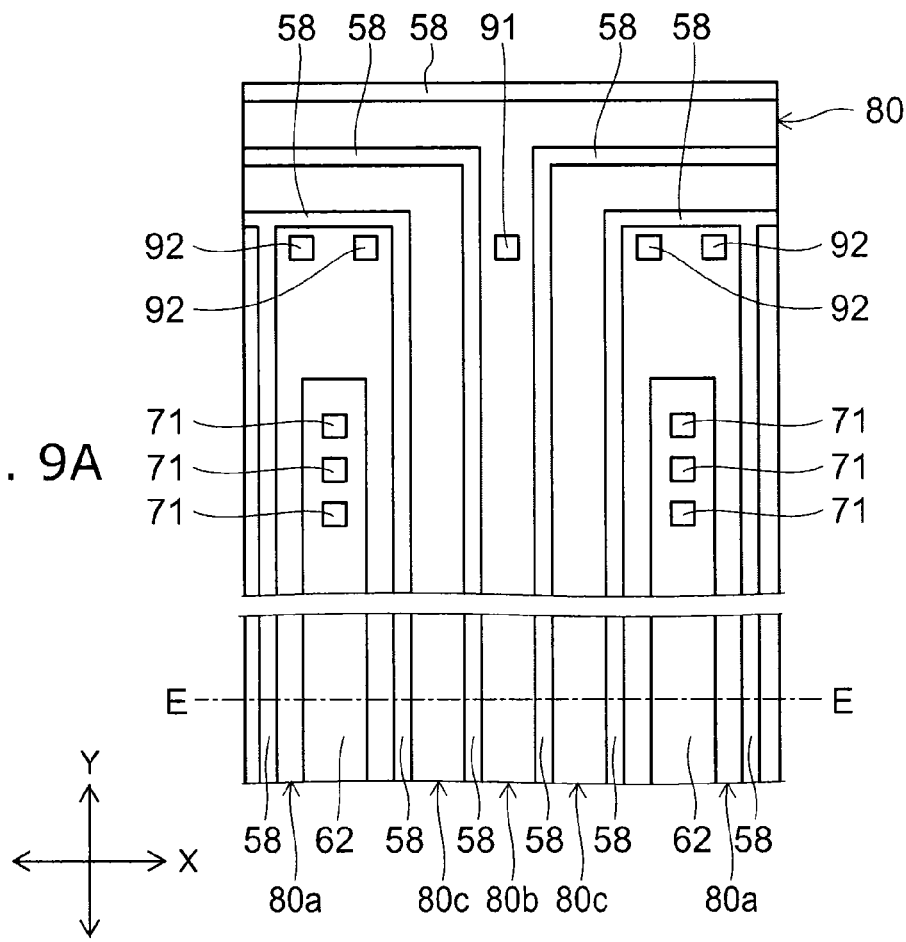
Figure 9B:
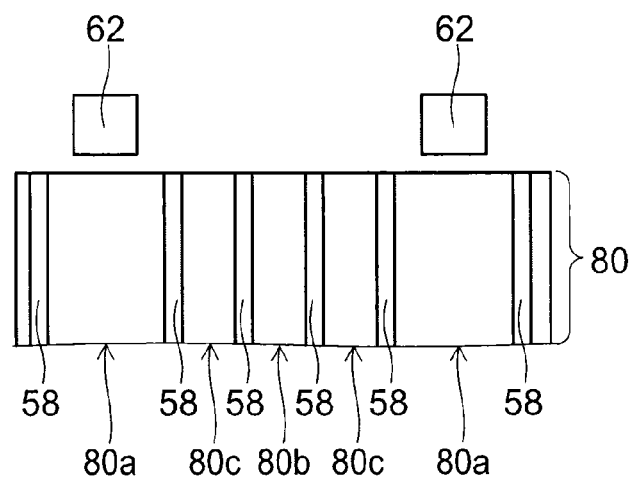

FIG. 9A is a schematic plan view of the peripheral region that is similar to FIG. 5A; and FIG. 9B corresponds to the E-E cross section of FIG. 9A.

In the specific example as well, the conductive layer 80 of the peripheral region is divided into the multiple blocks 80a, 80b, and 80c by the insulating separation films 58. In other words, the bypass condenser including multiple capacitances is formed between the mutually-adjacent resistance elements 62; and the crosstalk between the resistance elements 62 can be prevented even in the case where the frequency of the voltage applied to the resistance elements 62 is high.

One conductive layer block 80*b* and two conductive layer blocks 80*c* that are divided by four insulating separation films 58 are provided under the region between the mutually-adjacent resistance elements 62.

The resistance element 62 is not provided on the conductive layer block 80*b* and the conductive layer block 80*c*. By providing the potential to the conductive layer block 80*b*, one resistance element 62 is not affected by the potential of a resistance element 62 adjacent to the one resistance element 62; and the crosstalk between the mutually-adjacent resistance elements 62 can be prevented.

For example, the ground potential may be provided to the conductive layer block 80*b*. Or, an intermediate potential (e.g., (Vmax+Vmin)/2) that is between the maximum voltage Vmax and the minimum voltage Vmin applied to the resistance element 62 may be provided to the conductive layer block 80*b*.

By providing the intermediate potential to the conductive layer block 80*b*, the maximum voltage that is applied to the resistance elements 62, the conductive layer 80, and the bypass condenser can be relaxed; and the stress on the insulating films (the inter-layer insulating film 61 and the insulating separation films 58) can be reduced.

A potential also can be provided to the conductive layer block 80*a* under the resistance element 62. The potential of the conductive layer block 80*c*, which is between the conductive layer block 80*a* and the conductive layer block 80*b* to which potentials are provided, is floating. Therefore, the effective film thickness of the insulating films can be increased; and the stress on the insulating films (the inter-layer insulating film 61 and the insulating separation films 58) can be reduced.

Moreover, the insulating separation film 58 is not provided directly under the resistance element 62. Therefore, the unevenness of the stacked body under the resistance element 62 can be reduced; and the lithography defocus of the resistance element 62 can be reduced.

A method for manufacturing the semiconductor memory device of the embodiment will now be described.

FIG. 10A to FIG. 23 are schematic cross-sectional views showing the method for manufacturing the semiconductor memory device of the embodiment. In each of FIG. 10A to FIG. 23, the left side shows the structural body of the memory cell array region; and the right side shows the structural body of the peripheral region.

The conductive layer 50 is formed on the insulating film 49 after forming the transistors Tr, the interconnects, the inter-layer insulating films, the insulating film 49, etc., described above in the memory cell array region and the peripheral region of the substrate 10.

The conductive layer 50 is a polycrystalline silicon film to which boron or phosphorus is added as an impurity to provide conductivity. The conductive layer 50 is formed in the memory cell array region and the peripheral region; and the conductive layer 50 that is formed in the memory cell array region functions as the back gate BG.

Figure 10A:
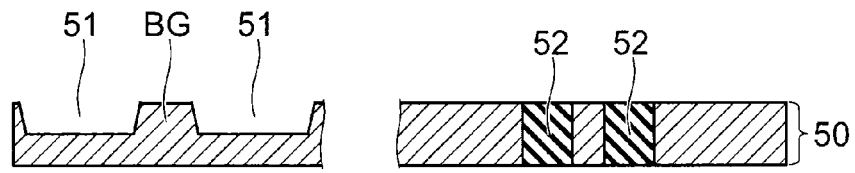
FIG. 10A to FIG. 23 are schematic cross-sectional views showing a method for manufacturing the semiconductor memory device of the embodiment.

As shown in FIG. 10A, multiple recesses 51 are made in the back gate BG by etching using a not-shown mask.

The insulating separation film 52 is formed in the conductive layer 50 of the peripheral region. The insulating separation film 52 is filled into a trench made in the conductive layer 50.

Figure 10B:
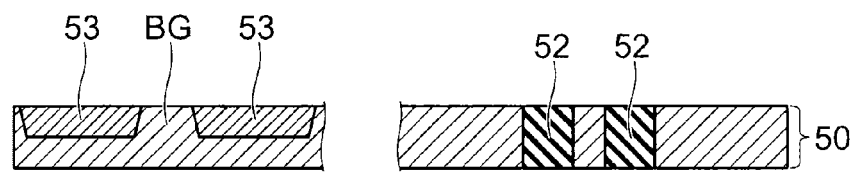

As shown in FIG. 10B, a sacrificial film 53 is filled into the recesses 51 of the back gate BG. The sacrificial film 53 is a non-doped silicon film. Herein, being non-doped means that impurities that provide conductivity are not deliberately added to the silicon film; and impurities other than the elements due to the source-material gas in the film formation substantially are not included.

Then, a stacked body is formed in the memory cell array region on the back gate BG and on the sacrificial film 53, and in the peripheral region on the conductive layer 50 and on the insulating separation film 52. The stacked body includes the multiple electrode films WL as the first silicon films, and the multiple second silicon films 54. The second silicon films 54 and the electrode films WL are stacked alternately.

The number of layers of the electrode films WL is arbitrary and is not limited to the number of layers shown. The number of layers of the second silicon films 54 changes according to the number of layers of the electrode films WL.

The electrode film WL is a polycrystalline silicon film to which, for example, boron is added as an impurity. The second silicon film 54 is a non-doped silicon film to which an impurity that provides conductivity is not deliberately added and which substantially does not include an impurity other than the elements due to the source-material gas in the film formation.

The second silicon films 54 in the memory cell array region are ultimately replaced in a subsequent process with the insulating films 21 shown in FIG. 2 and FIG. 3.

Figure 11:
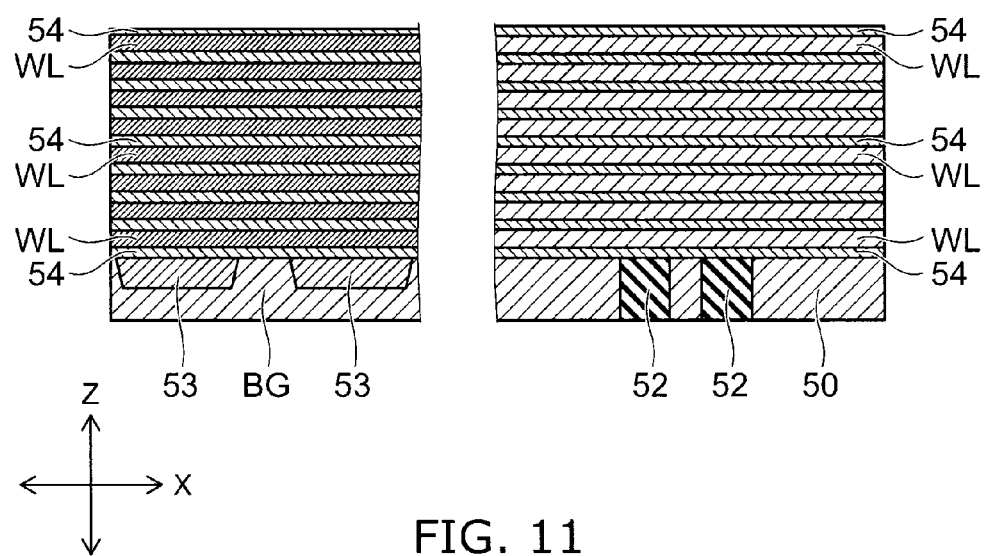
Figure 12:
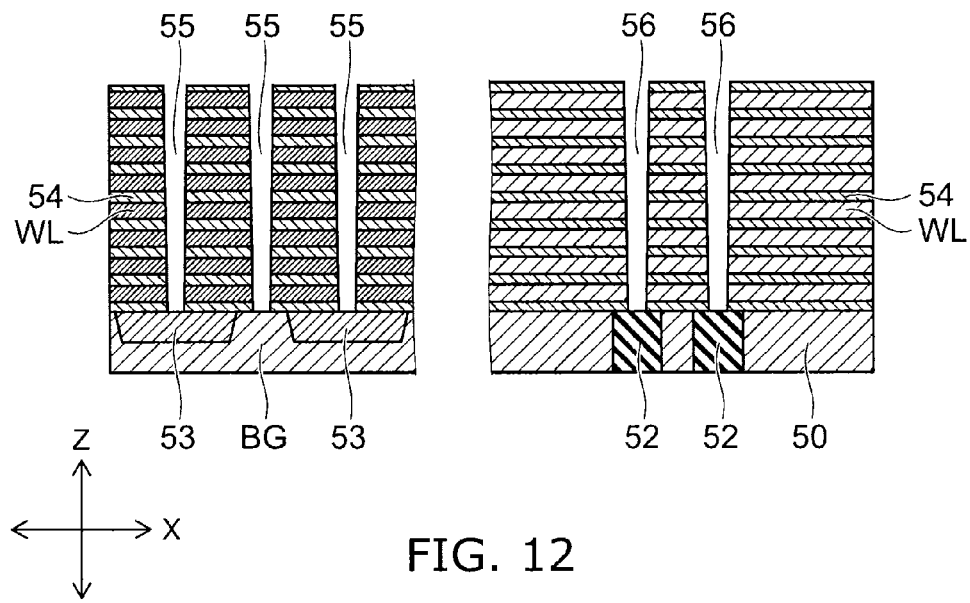

After forming the stacked body shown in FIG. 11, multiple slits 55 and 56 that pierce the stacked body as shown in FIG. 12 are made simultaneously by photolithography and etching.

The slit 55 on the sacrificial film 53 and on the back gate BG between the mutually-adjacent sacrificial films 53 in the memory cell array region divides the stacked body in the X-direction. The slit 55 extends in the Y-direction.

The slit 56 on the insulating separation film 52 in the peripheral region divides the stacked body in the X-direction. The slit 56 extends in the Y-direction.

Figure 13:
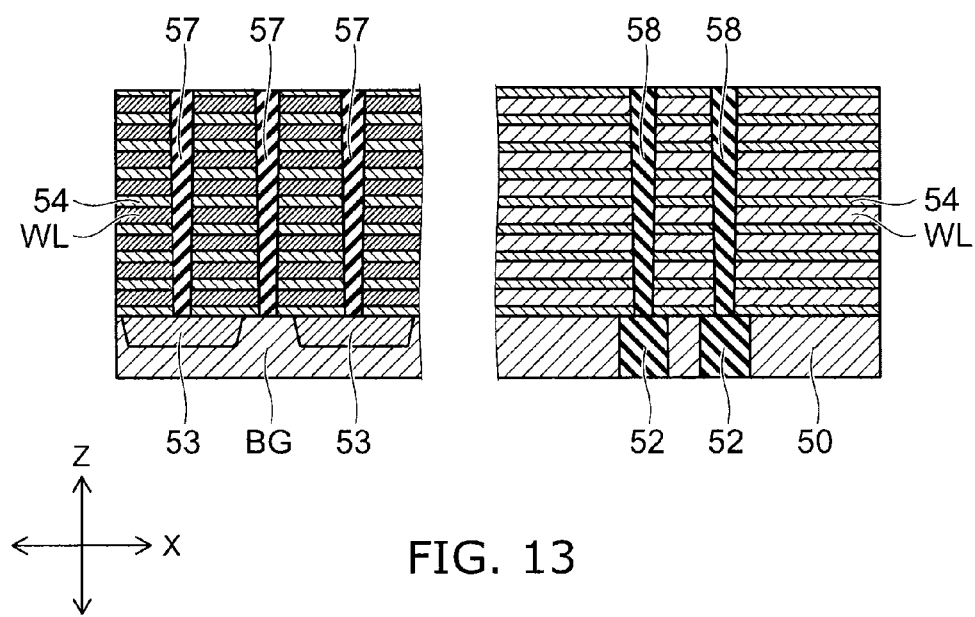

As shown in FIG. 13, the insulating separation film 57 and the insulating separation film 58 are filled respectively into the slit 55 and the slit 56. The insulating separation film 57 and the insulating separation film 58 are films of the same material formed simultaneously by, for example, CVD (Chemical Vapor Deposition). The insulating separation film 57 and the insulating separation film 58 are, for example, silicon nitride films or silicon oxide films.

Figure 14:
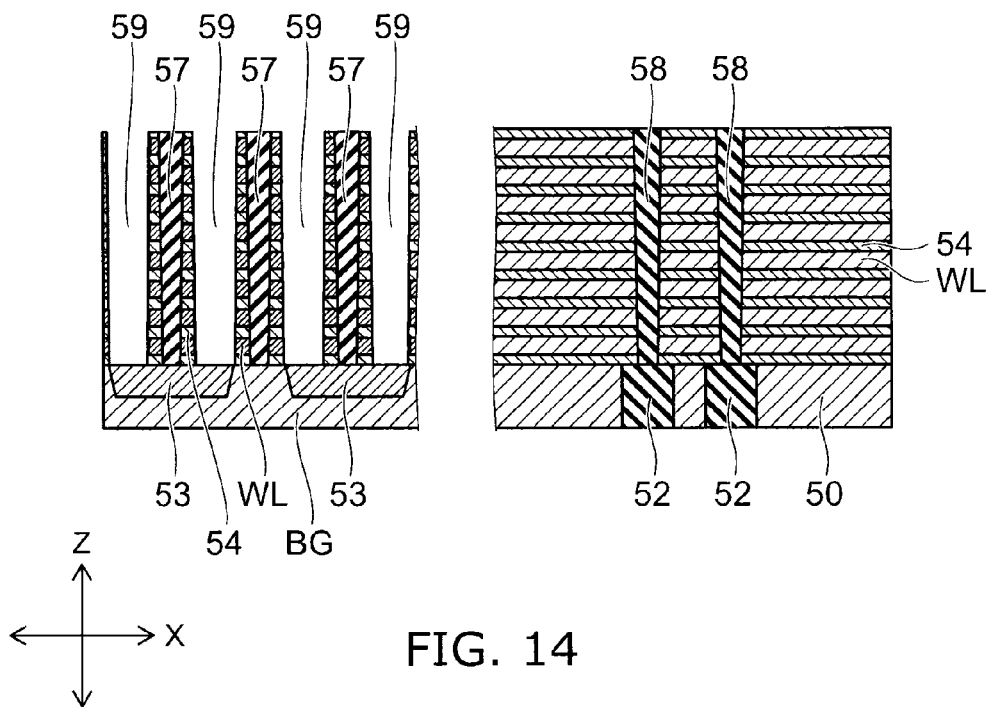

After forming the insulating separation films 57 and 58, multiple holes 59 are made in the stacked body of the memory cell array region as shown in FIG. 14. The multiple holes 59 are made by, for example, RIE (Reactive Ion Etching) using a not-shown mask. Holes are not made in the peripheral region.

The holes 59 pierce the stacked body of the memory cell array region to reach the sacrificial film 53. The sacrificial film 53 is exposed at the bottoms of the holes 59. The electrode films WL and the second silicon films 54 are exposed at the side walls of the holes 59.

Because the entire stacked body of the memory cell array region is made of silicon films, the condition settings of the RIE and the controllability of the configurations of the holes 59 are easy.

After making the holes 59, the sacrificial film 53 and the second silicon films 54 are removed by, for example, wet etching. At this time, an alkaline chemical liquid such as, for example, a KOH (potassium hydroxide) solution, etc., may be used as the etchant.

Figure 15:
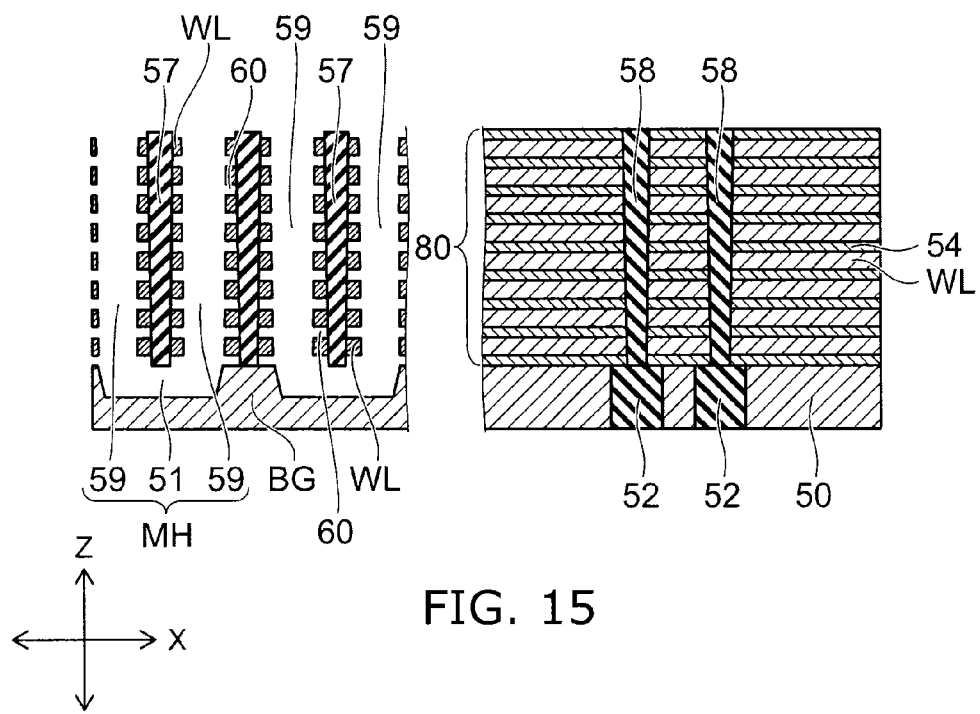

FIG. 15 shows the state after the sacrificial film 53 and the second silicon films 54 are removed by wet etching.

The etching rate of the silicon film for the alkaline chemical liquid depends on the concentration of the impurity that is doped into the silicon film. For example, the etching rate decreases abruptly when the boron concentration inside the silicon film becomes $1 \times 10^{20}$ (cm$^{-3}$) or more, and decreases to become the etching rate of a boron concentration of not more than $1 \times 10^{19}$ (cm$^{-3}$) multiplied by the reciprocal of several tens.

Accordingly, according to the embodiment, the sacrificial film 53 and the second silicon films 54 which are non-doped silicon films are removed through the holes 59 by the wet etching recited above. On the other hand, the back gate BG and the electrode films WL to which, for example, boron is added as an impurity remain.

By the removal of the sacrificial film 53, the recesses 51 made in the back gate BG in the previous process appear. A pair of holes 59 communicates with one recess 51. In other words, one memory hole MH having a U-shaped configuration is made in the memory cell array region by the bottoms of the pair of holes 59 communicating with one common recess 51.

A gap 60 is made between the electrode films WL by the removal of the second silicon films 54. The gap 60 communicates with the memory hole MH.

The electrode films WL are supported by the insulating separation film 57 on the back gate BG and are maintained in a state in which the electrode films WL are stacked to be separated by the gap 60.

Figure 16:
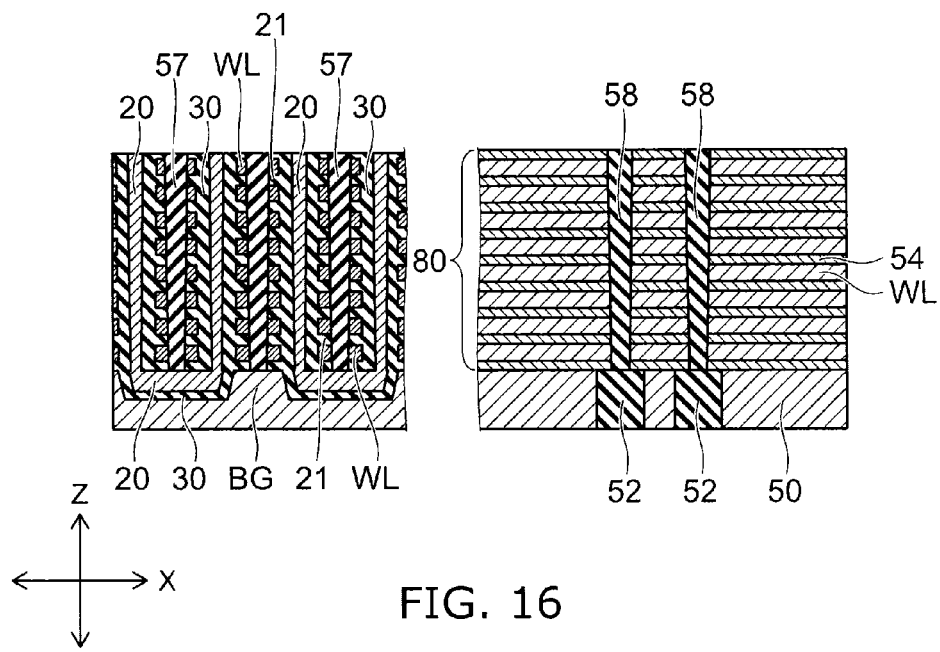

After the wet etching recited above, as shown in FIG. 16, the memory film 30 is formed on the inner wall of the memory hole MH; and the insulating films 21 are formed in the gap 60.

As described above referring to FIG. 2, the memory film 30 includes the blocking film 31, the charge storage film 32, and the tunneling film 33 stacked in order from the inner wall side of the memory hole MH. The insulating films 21 are formed in the gap 60 simultaneously with the formation of the memory film 30 on the side wall of the memory hole MH. Accordingly, the insulating films 21 include at least the blocking film 31 which is a portion of the memory film 30.

According to the height of the gap 60 and the film thickness of each of the films included in the memory film 30, there are cases where the gap 60 between the electrode films WL is filled with only the blocking film 31; and there are cases where a stacked film that includes the blocking film 31 and the charge storage film 32 or a stacked film that includes the blocking film 31, the charge storage film 32, and the tunneling film 33 is filled into the gap 60 as the insulating films 21.

After forming the memory film 30, the channel body 20 is formed inside the memory hole MH of the memory region cell array.

In the peripheral region, the second silicon films 54 remain without being replaced with insulating films. In other words, the conductive layer 80 that includes the multiple layers of the electrode films WL and the multiple layers of the second silicon films 54 is provided on the conductive layer 50 of the peripheral region.

Figure 17:
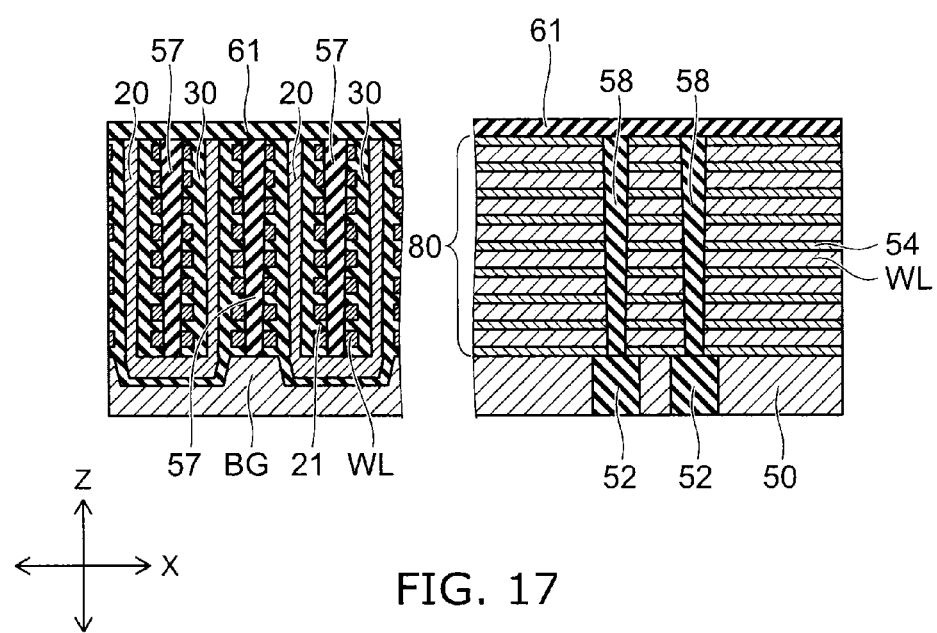

Then, as shown in FIG. 17, the inter-layer insulating film 61 is formed on the stacked body of the memory cell array region and on the conductive layer 80 of the peripheral region. The inter-layer insulating film 61 is, for example, a silicon nitride film that is formed simultaneously in the memory cell array region and the peripheral region.

Figure 18:
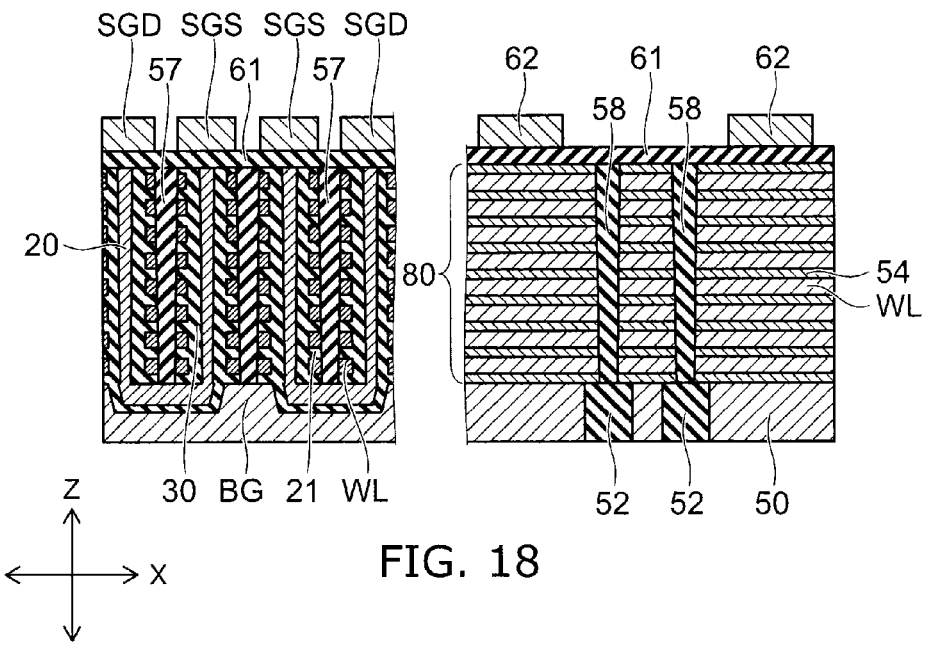

As shown in FIG. 18, the drain-side selection gate SGD and the source-side selection gate SGS are formed on the inter-layer insulating film 61 of the memory cell array region. The resistance element 62 is formed on the inter-layer insulating film 61 of the peripheral region.

The selection gates SGD and SGS and the resistance element 62 are made of the same material (e.g., tungsten silicide) and are formed simultaneously.

After the conductive film is formed on the entire surface of the inter-layer insulating film 61 in the memory cell array region and the peripheral region, the selection gates SGD and SGS are formed in the memory cell array region and the resistance element 62 is formed in the peripheral region by patterning using a not-shown mask.

Figure 19:
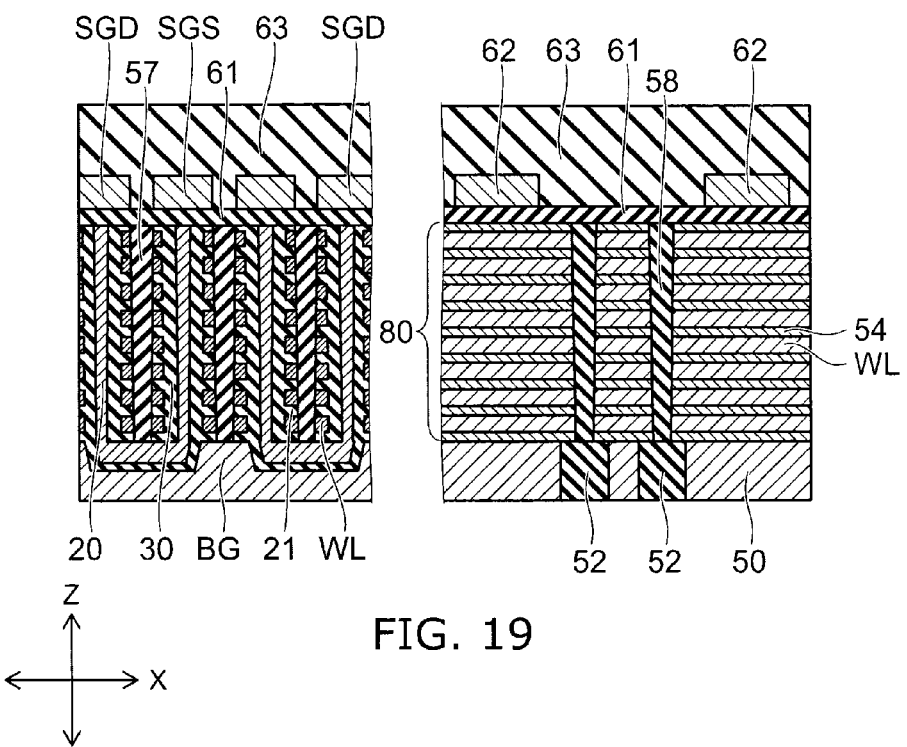

The inter-layer insulating film 63 shown in FIG. 19 is formed to cover the selection gates SGD and SGS and the resistance element 62 that are on the inter-layer insulating film 61.

Figure 20:
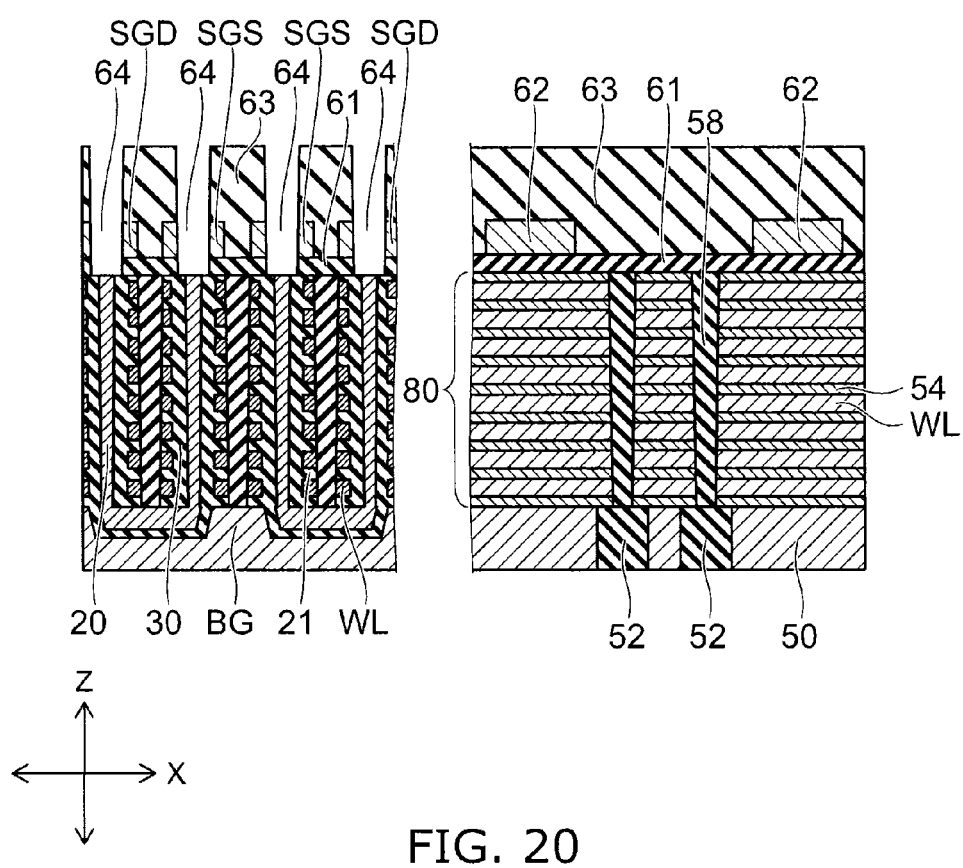

In the memory cell array region as shown in FIG. 20, slits 64 are made to pierce the inter-layer insulating film 63 and the selection gates SGD and SGS to reach the channel bodies 20.

Figure 21:
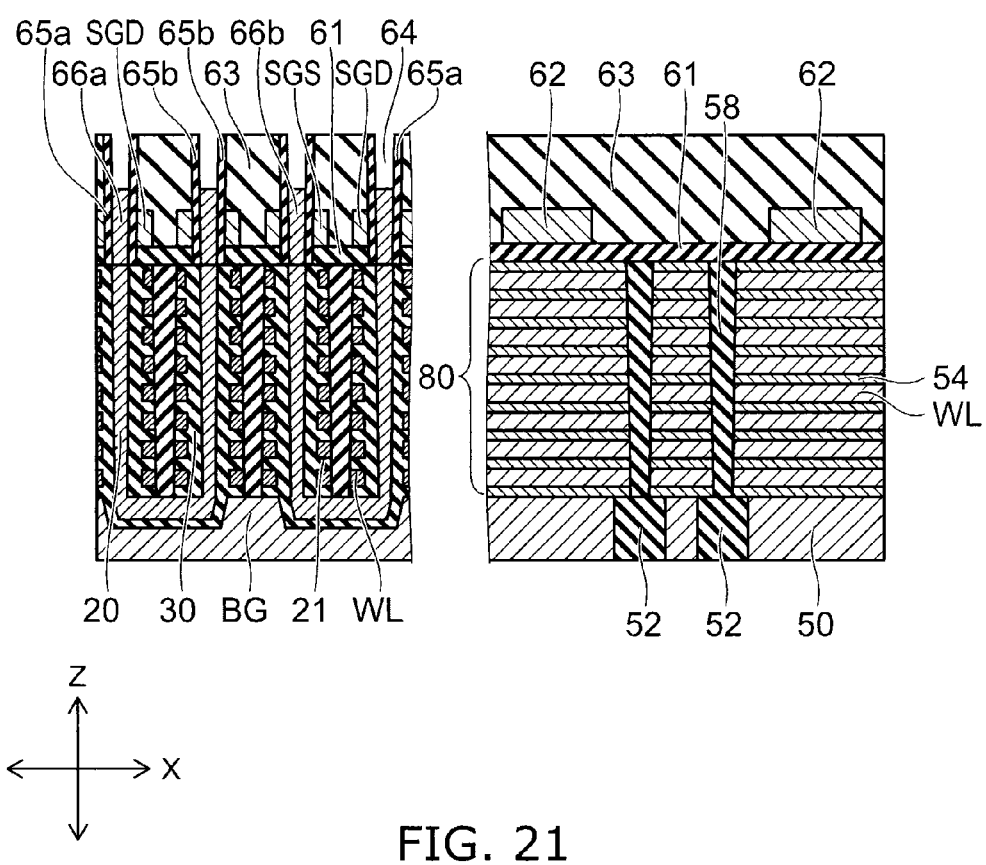

As shown in FIG. 21, the gate insulating films 65a and 65b are formed on the side walls of the slits 64. The gate insulating film 65a is formed on the side wall of the drain-side selection gate SGD; and the gate insulating film 65b is formed on the side wall of the source-side selection gate SGS. The gate insulating films 65a and 65b are, for example, silicon nitride films.

A silicon film is formed as the channel body 66a on the inner wall of the gate insulating film 65a that is formed on the side wall of the drain-side selection gate SGD. A silicon film is formed as the channel body 66b on the inner wall of the gate insulating film 65b that is formed on the side wall of the source-side selection gate SGS.

After forming the channel bodies 66a and 66b inside the slits 64, the upper portions of the channel bodies 66a and 66b are removed to make recesses at the upper end opening side of the slits 64.

Figure 22:
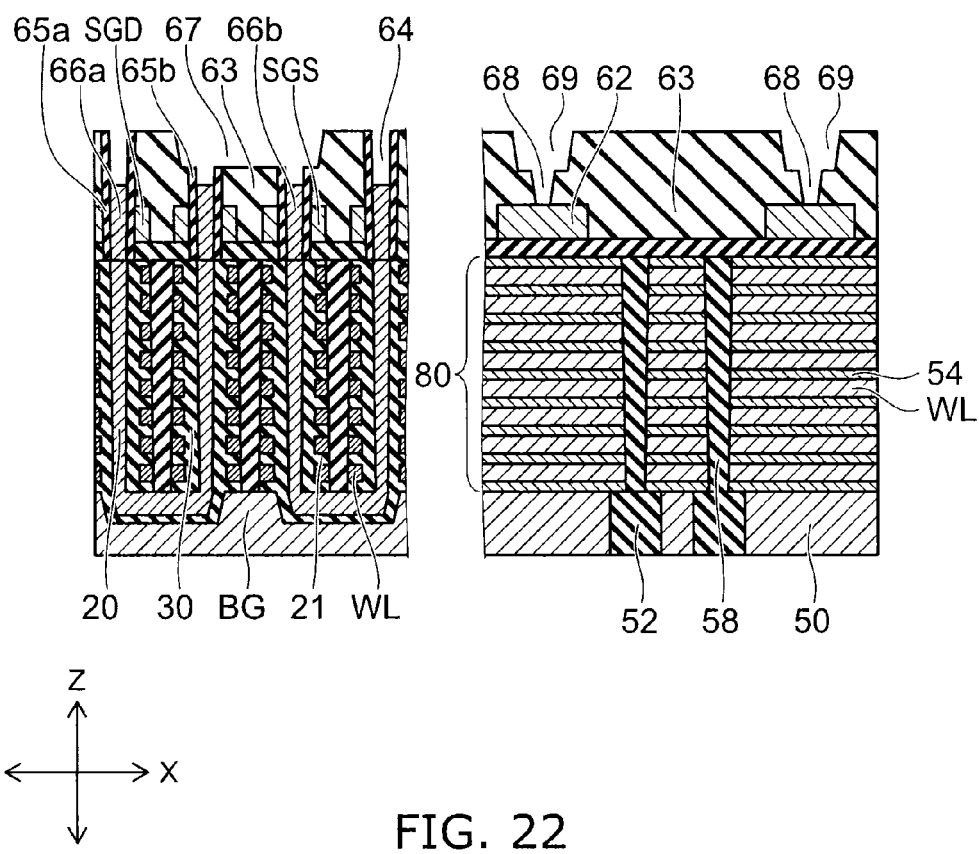

Then, as shown in FIG. 22, a recess 67 is made in the inter-layer insulating film 63 that is on the source-side selection gates SGS; and the upper ends of the channel bodies 66b between the source-side selection gates SGS are exposed in the recess 67.

Also, a via hole 68 and a trench 69 are made in the inter-layer insulating film 63 of the peripheral region. The via hole 68 reaches the resistance element 62. The trench 69 communicates with the via hole 68.

Figure 23:
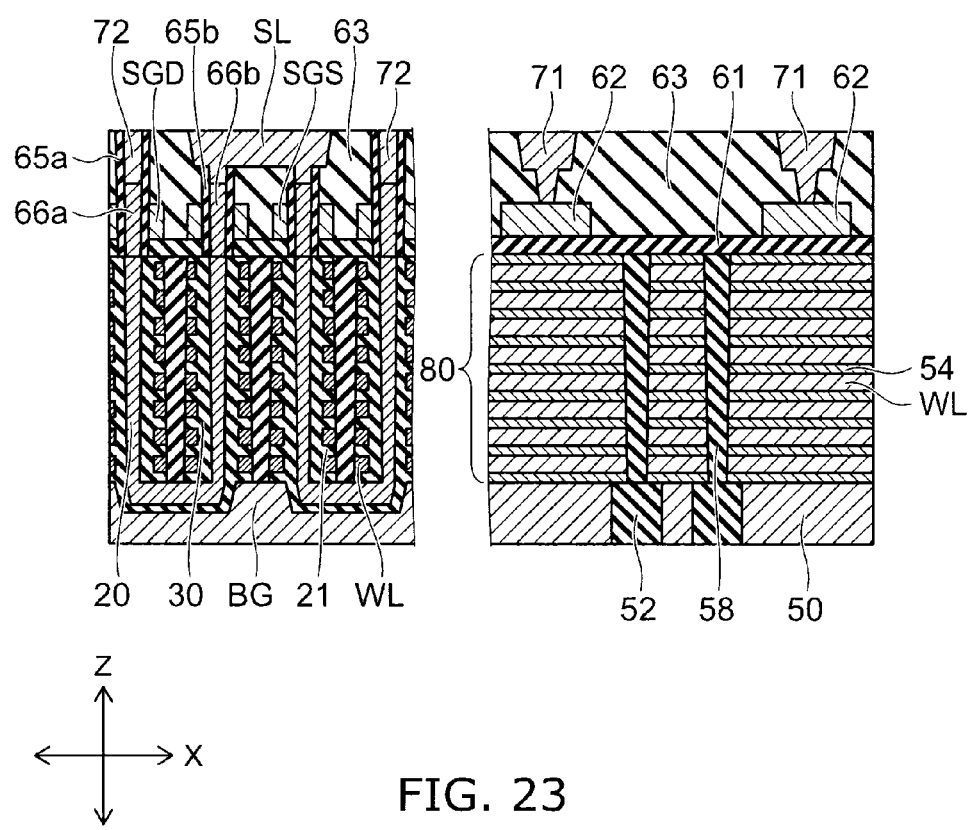

As shown in FIG. 23, the source line SL is filled into the recess 67. The source line SL is connected to the channel bodies 66b of the source-side selection transistors.

A contact plug 72 is filled into the slit 64 that is on the drain-side selection gate SGD. The contact member 71 is filled into the via hole 68 and the trench 69 of the peripheral region. The contact member 71 is connected to the resistance element 62.

As shown in FIG. 3, the inter-layer insulating film 73 is formed on the inter-layer insulating film 63 and on the source line SL in the memory cell array region. The bit line BL is formed on the inter-layer insulating film 73. The bit line BL is connected to the channel body 66a of the drain-side selection transistor STD via the contact plug 72.

According to the embodiment, the patterning of the structural body of the memory cell array region is performed simultaneously with the patterning of the structural body of the peripheral region. In other words, the insulating separation film 58 and the resistance element 62 of the peripheral region can be formed without adding a process to the processes that form the memory cell array 1.

Further, according to the embodiment, the resistance element 62 of the same level as the selection gates SGD and SGS of the memory cell array 1 can be used as the resistance element of the peripheral circuit without forming the resistance element by using the MOS gate electrode material that is formed in the substrate front surface. Therefore, it is possible to reduce not only the surface area of the peripheral circuit but also the chip size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a substrate including a memory cell array region and a peripheral region of a periphery of the memory cell array region;
    a stacked body provided on the memory cell array region of the substrate, the stacked body including a plurality of electrode films and a plurality of insulating films provided respectively between the electrode films;
    a channel body extending through the stacked body in a stacking direction of the electrode films and the insulating films;
    a memory film provided between a side wall of the channel body and each of the electrode films;
    a plurality of first insulating separation films extending in the stacking direction through the stacked body to divide the stacked body into a plurality in a first direction;
    a first inter-layer insulating film provided on the stacked body;
    a selection gate provided on the first inter-layer insulating film to extend in a second direction intersecting the first direction;
    a conductive layer provided on the peripheral region of the substrate, the conductive layer including a film of a same material as the electrode film;
    a second inter-layer insulating film provided on the conductive layer;
    a plurality of resistance elements provided on the second inter-layer insulating film, and provided in a same layer as the selection gate; and
    a plurality of second insulating separation films configured to divide the conductive layer of the peripheral region into a block under the resistance element and at least one block provided under a region between the resistance elements adjacent to each other.

2. The device according to claim 1, wherein the first insulating separation films and the second insulating separation films are a same material.

3. The device according to claim 1, wherein a pitch of the first insulating separation films in the first direction is a same as a pitch of the second insulating separation films in the first direction.

4. The device according to claim 1, wherein the second insulating separation films are not provided under the resistance elements.

5. The device according to claim 1, wherein at least three of the blocks of the conductive layer are provided under the region between the resistance elements and separated by at least four of the second insulating separation films.

6. The device according to claim 5, wherein the at least three of the blocks of the conductive layer include:
    a first block to which a potential is applied;
    a second block provided under the resistance elements; and
    a third block provided between the first block and the second block, the third block set a floating state.

7. The device according to claim 1, wherein a potential is applied to the block of the conductive layer under the region between the resistance elements.

8. The device according to claim 7, wherein the potential is a ground potential.

9. The device according to claim 7, wherein the potential is an intermediate potential between the maximum potential and the minimum potential applied to the resistance elements.

10. The device according to claim 1, wherein the conductive layer includes:
    a plurality of first films of the same material as the electrode films of the memory cell array region; and
    a plurality of second films provided respectively between the first films.

11. The device according to claim 1, wherein a width of the first insulating separation films in the first direction is a same as a width of the second insulating separation films in the first direction.

12. The device according to claim 10, wherein the number of layers of the electrode films is a same as the number of layers of the first films.

13. The device according to claim 1, further comprising a lower gate provided between the substrate and the stacked body,
    the channel body being formed in a U-shaped configuration including a pair of columnar portions extending in the stacking direction through the stacked body, and a linking portion provided inside the lower gate to link the pair of columnar portions.

14. The device according to claim 13, further comprising:
    a second conductive layer provided between the substrate and the conductive layer in the peripheral region, the second conductive layer being of a same material as the lower gate; and
    a third insulating separation film provided under the second insulating separation films to divide the second conductive layer in the first direction.

15. The device according to claim 13, wherein each of the first insulating separation films is provided between the pair of columnar portions.

* * * * *